US010256782B2

(12) United States Patent
La Grou

(10) Patent No.: US 10,256,782 B2
(45) Date of Patent: Apr. 9, 2019

(54) MULTI-PATH POWER AMPLIFIER

(71) Applicant: John Howard La Grou, Placerville, CA (US)

(72) Inventor: John Howard La Grou, Placerville, CA (US)

(*) Notice: Subject to any disclaimer, the term of this patent is extended or adjusted under 35 U.S.C. 154(b) by 0 days.

(21) Appl. No.: 15/496,326

(22) Filed: Apr. 25, 2017

(65) Prior Publication Data
US 2018/0309420 A1  Oct. 25, 2018

(51) Int. Cl.
H03F 3/68 (2006.01)
H03F 3/181 (2006.01)
H03F 3/21 (2006.01)
H03F 3/72 (2006.01)
H03G 3/30 (2006.01)

(52) U.S. Cl.
CPC ............. H03F 3/68 (2013.01); H03F 3/181 (2013.01); H03F 3/211 (2013.01); H03F 3/72 (2013.01); H03G 3/3005 (2013.01); H03F 2200/03 (2013.01); H03F 2200/321 (2013.01); H03F 2200/541 (2013.01); H03F 2203/7236 (2013.01); H03F 2203/7239 (2013.01); H03G 2201/506 (2013.01)

(58) Field of Classification Search
CPC .. H03F 3/68; H03F 3/24; H03F 3/181; H03G 3/20
USPC ........................................ 330/124 R, 295, 51
See application file for complete search history.

(56) References Cited

U.S. PATENT DOCUMENTS

| 3,345,578 | A | 10/1967 | Shuda |
| 3,436,676 | A | 4/1969 | Cook |
| 3,449,685 | A | 6/1969 | Holmes |
| 3,845,416 | A | 10/1974 | Dolby |
| 4,410,879 | A | 10/1983 | Gumm |
| 4,450,433 | A | 5/1984 | Moriyama |

(Continued)

FOREIGN PATENT DOCUMENTS

| CN | 201550079 U | 8/2010 |
| EP | 0346605 A2 | 12/1989 |

(Continued)

OTHER PUBLICATIONS

Thomas Frederiksen, Henrik Bengtsson, Karsten Nielsen, A novel Audio Power Amplifier Topology with High Efficiency and State-of-the-art performance, Audio Engineering Society Preprint presented at the 109th Convention Sep. 22-25, 2000 Los Angeles California, USA, Sep. 22, 2000, Audio Engineering Society, New York, New York, U.S.

(Continued)

Primary Examiner — Khanh V Nguyen
Assistant Examiner — Khiem D Nguyen
(74) Attorney, Agent, or Firm — Stone Creek Services LLC; Alan M Flum

(57) ABSTRACT

A multi-path power amplifier that includes two or more amplifier paths where the amplifier path having the most favorable dynamic resolution of the momentary signal is utilized. The amplifier paths are adaptively controlled by a processor, DSP, or other suitable digital processing. This results in significantly improved power amplifier dynamic range and broadband noise-floor performance, for example, as compared with traditional audio-frequency power amplifiers.

19 Claims, 16 Drawing Sheets

(56) References Cited

U.S. PATENT DOCUMENTS

| | | | |
|---|---|---|---|
| 4,598,252 A * | 7/1986 | Andricos | H03F 3/72 330/124 R |
| 4,843,392 A | 6/1989 | Gulcynski | |
| 4,868,571 A | 9/1989 | Nami | |
| 4,947,172 A | 8/1990 | Suzuki | |
| 5,148,163 A | 9/1992 | Frindle | |
| 5,323,159 A | 6/1994 | Imamura et al. | |
| 6,163,288 A | 12/2000 | Yoshizawa | |
| 6,201,490 B1 | 3/2001 | Kawano et al. | |
| 6,204,790 B1 | 3/2001 | Jin et al. | |
| 6,359,514 B1 | 3/2002 | King et al. | |
| 6,362,764 B1 | 3/2002 | Niimi et al. | |
| 6,472,935 B2 | 10/2002 | King et al. | |
| 6,473,013 B1 | 10/2002 | Velazquez et al. | |
| 6,489,909 B2 | 12/2002 | Nakao et al. | |
| 6,593,868 B2 | 7/2003 | Clara et al. | |
| 6,639,463 B1 | 10/2003 | Ghanadan et al. | |
| 6,697,004 B1 | 2/2004 | Galton et al. | |
| 6,744,312 B2 | 6/2004 | White et al. | |
| 6,822,595 B1 | 11/2004 | Robinson | |
| 6,853,244 B2 | 2/2005 | Robinson et al. | |
| 6,897,794 B2 | 5/2005 | Kuyel et al. | |
| 7,170,341 B2 | 1/2007 | Conrad et al. | |
| 7,375,669 B2 | 5/2008 | Kim et al. | |
| 7,414,558 B2 | 8/2008 | Rivoir et al. | |
| 7,579,971 B2 | 8/2009 | Washburn et al. | |
| 7,826,578 B1 | 11/2010 | Melanson et al. | |
| 9,397,678 B2 | 7/2016 | Zhu | |
| 9,402,128 B2 | 7/2016 | Waller, Jr. | |
| 9,431,966 B2 | 8/2016 | Wang et al. | |
| 2002/0050937 A1 | 5/2002 | Boehm et al. | |
| 2003/0038674 A1 | 2/2003 | Masuda et al. | |
| 2003/0063022 A1 | 4/2003 | Eriksson et al. | |
| 2003/0083031 A1 | 5/2003 | Erikssson et al. | |
| 2004/0213356 A1 | 10/2004 | Burke | |
| 2013/0234871 A1 | 9/2013 | Eliezer et al. | |
| 2013/0234873 A1 | 9/2013 | Wyville | |
| 2014/0240154 A1 | 8/2014 | Kim et al. | |
| 2015/0035596 A1 | 2/2015 | Nussbaum et al. | |
| 2015/0048959 A1 | 2/2015 | Zhu | |
| 2016/0142069 A1 | 5/2016 | La Grou | |
| 2016/0344401 A1 | 11/2016 | La Grou | |

FOREIGN PATENT DOCUMENTS

| | | |
|---|---|---|
| EP | 0790709 A1 | 8/1997 |
| WO | 2016118674 A1 | 7/2016 |

OTHER PUBLICATIONS

Paul Pickering, Electronic Design, Feb. 16, 2016, Penton Media Inc., New York, New York, U.S.

Remy Cellier et al., An review of fully digital audio class D amplifiers topologies, IEEE North-East Workshop on Circuits and Systems, 2009, Aug. 2009, HAL Archives, Toulouse, France.

Direct Digital Amplification DDX The Evolution of Digital Amplification , Dec. 31, 2013, Tempo Semiconductor Inc., Austin, Texas, US.

* cited by examiner

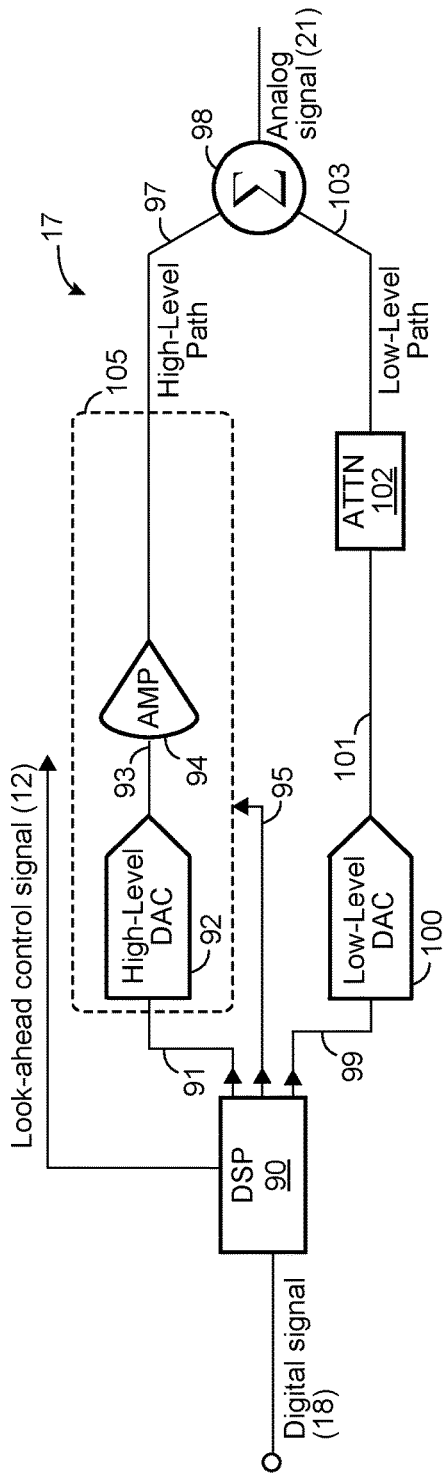
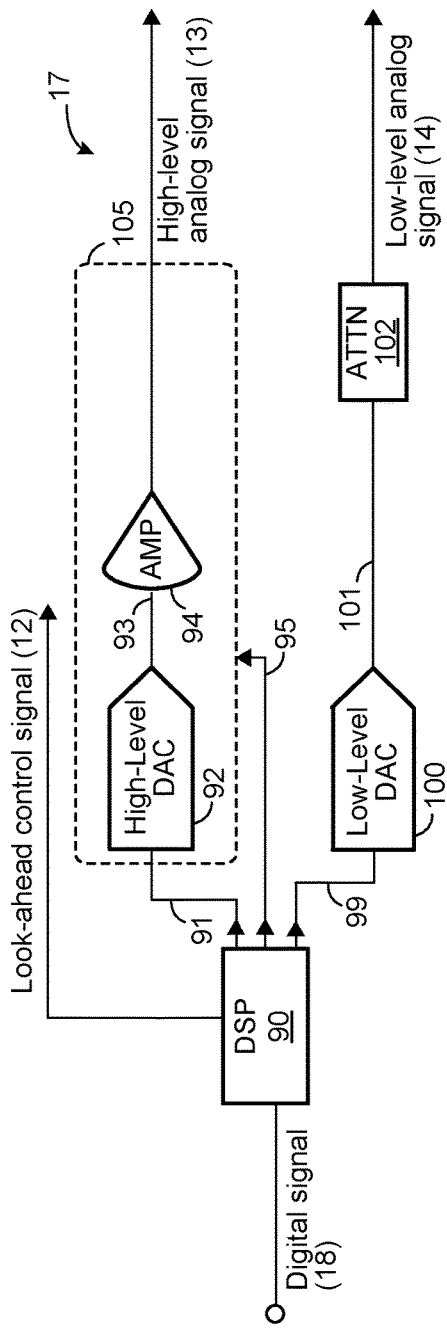
FIG. 11
FIG. 12

MULTI-PATH POWER AMPLIFIER

BACKGROUND

The present disclosure relates to electronic amplifiers and amplification methods adapted to drive transducers and other electronic loads. Electronic amplifiers are also referred to in this disclosure as power amplifiers.

Power amplifiers typical amplify small electronic signals to a level and a power output sufficient to drive one or more transducers (i.e. a device that converts electrical energy into mechanical vibration) or other electronic loads (such as resistive loads). For example, audio power amplifiers can have power output sufficient to drive one or more loudspeakers, headphones, ear-canal phones (earbuds), direct current (DC) resistive loads or alternating current (AC) reactive loads. For example, a typical professional audio power amplifier for commercial use, can accept a professional line-level signal, for example a nominal line-level signal of 0.775 Volts root-mean-square (Vrms), and create an output capable of driving a hundreds or even thousands of Watts in one or more loudspeakers. Other power amplifiers are designed to amplify smaller signals, for example with a nominal level of 0.316 Vrms, and drive small amounts of power, for example 0.1 Watts to 2 Watts into headphones or earbuds. Other power amplifiers are designed amplify and/or drive other line-level signals into resistive or reactive loads.

Many power amplifier topologies exist for driving transducers and/or AC reactive and DC resistive loads. Some of these power amplifier topologies are designed to receive and amplify analog signals. These include class A, class AB, class B, class C, class D, class E, class F, class G, class DG, and class H, class S, class T amplifiers, as well has hybrids of these topologies. These topologies, among others, typically have various tradeoffs between distortion (signal linearity) and power efficiency. Other power amplifier topologies are designed to receive digital signals and output an analog signal capable of driving one or more transducers. For example, a power amplifier can use digital-to-analog conversion to convert a digital signal to an analog signal followed one or more of the various classes of amplifiers to amplify the analog signal.

With the advent of modern signal process devices and techniques, wide dynamic range signals are becoming more available. For example, it is not uncommon for digital audio signal paths to be 24 or 32 bits wide. This translates into a potential dynamic range (i.e. ratio of maximum signal level to noise-floor) of approximately 144 decibels (dB) for a 24-bit wide signal path and 192 dB of dynamic range for a 32-bit signal path.

SUMMARY

While wide dynamic range digital audio signal paths can be 24 or 32 bits wide, there generally has not been a way to create an analog signal that can take advantage of the wide dynamic range potentially available from these wide signal paths. Conventional wisdom held that the dynamic range was limited by the "noise-floor" or self-noise of a digital-to-analog converter (DAC) used to convert the digital signal to an analog signal.

The inventor discovered that contrary to conventional wisdom, the noise-floor of the DAC did not have to be the limiting factor for dynamic range. The inventor created a DAC where the digital signal was divided into portions according to level and mapped across multiple DACs. This is the subject of the inventor's U.S. Pat. No. 9,590,648, "Multi-path Digital-to-Analog Converter," issued on Mar. 7, 2017.

While designing this multi-path DAC, the inventor realized that he was unaware of any commercial power amplifiers or power amplifier topologies capable of taking advantage of the full dynamic range of his multi-path DAC. The inventor set out to develop a power amplifier capable of reproducing the dynamic range comparable with his multi-range DAC. The inventor discovered that he could do this by creating a multi-path amplifier that included two or more paths, each optimized for a particular range of signal levels. For example, a multi-path amplifier can include a first path and a second path, with the first path noise and level optimized for a higher-level range of signals than the second path. The paths can be selectively amplified according to signal level using a look-ahead control signal to control the selective amplification. The look-ahead control signal can be generated by a processor, digital processing device, microcontrollers, general purpose microprocessor, or a specialized processor, such as a digital signal processor (DSP), gate arrays or programmable logic devices such as field programmable gate arrays (FPGA), or other devices capable of digital signal processing of audio and other similarly complex signals. The processor can have access to a digital version of the signal levels of the signals present on the two or more signal paths. Alternatively, the processor can have access to a digital version of an equivalent composite signal. The signals present on the two or more signal paths are delayed with respect to the look-ahead control signal. This effectively gives the look-ahead control signal "pre-knowledge" of the signal levels on the two or more paths and optimize their control. This arrangement significantly improves power amplifier dynamic range and broadband noise-floor performance compared with traditional audio-frequency power amplifiers.

The inventor developed analog input multi-path and digital input multi-path power amplifier topologies that are described in more detail in the Detailed Description section of this disclosure. These topologies include the basic building block described in the preceding paragraph that selectively controls two or more signals paths each with a power amplifier optimized for a particular range of signal levels. One such topology includes a multi-path digital amplifier that receives a digital signal and outputs an amplified analog signal capable of powering a transducer. The multi-path digital amplifier receives the digital signal, generates the look-ahead control signal from the digital signal, generates two or more amplification paths based on signal level range, and selectively controls the output of these amplification paths by the look-ahead control signal. The path optimized for the higher-level signal range is noise managed by selectively removing the higher-level path from the output signal when a signal within its optimized range is not present. The path optimized for lower-level signals can be amplified, then attenuated so that the combination of the higher-level signal and the lower-level signal form an amplified linear representation of the original digital signal. Another topology includes a multi-path analog power amplifier that accepts a single analog signal and a look-ahead control signal generated from a digital representation of the analog signal. The analog signal is sent to two or more amplification paths. The amplification paths are noise-optimized by signal level range. The look-ahead control signal selectively controls these signal level paths so that higher-level signals are amplified by the components noise-optimized for higher-level signals and lower-level signals are amplified by the components noise-optimized for lower-level signals.

While the inventor originally conceived the multi-path power amplifier for wide dynamic range audio power amplification applications, the inventor envisions that multi-path power amplifiers can be used in a wide range of applications that require driving loads, for example transducers, AC impedances, and DC resistances, and faithfully reproducing a wide dynamic range signal. This will become apparent by a reader skilled in the art, after reviewing the various examples and embodiments described within this disclosure.

This Summary introduces a selection of concepts in simplified form that are described in the Description. The Summary is not intended to identify essential features or limit the scope of the claimed subject matter.

BRIEF DESCRIPTION OF THE DRAWINGS

FIG. 11 illustrates a simplified block diagram of a multiple-path DAC with a summed analog output.

FIG. 12 illustrates a simplified block diagram of a multiple-path DAC with multi-path analog outputs.

DETAILED DESCRIPTION

The following description is made with reference to figures, where like numerals refer to like elements throughout the several views.

FIGS. 1-4 illustrate simplified block diagrams of the inventor's multi-path power amplifier. The signal topologies of FIGS. 1-4 selectively amplify two or more signals using a look-ahead control signal 12 (shown in FIGS. 1, 2 and 4) that has pre-knowledge of the level of each signal present at their respective power amplifier. Each power amplifier can be associated with a particular signal that is optimized for a particular range of signal levels. Amplifiers optimized for lower signal levels typically will have a lower noise-floor than amplifiers optimized for higher signal levels. The look-ahead control signal 12 can be generated by a processor, such as a DSP, from a digital version of the signal levels of the two or more signals or alternatively from a digital version of an equivalent composite signal. This will be discussed in more detail for FIGS. 11-14. The look-ahead control signal 12 has so-called "pre-knowledge" of the signal levels on the two or more paths because the two or more signals are delayed with respect to the look-ahead control signal 12. Because lower-level signals and higher-level signals are selectively amplified by power amplifiers that are noise-optimized for their respective signal level range, the dynamic range and broadband noise-floor performance of the multi-path power amplifier is significantly improved over conventional power amplifiers.

Figure 1:
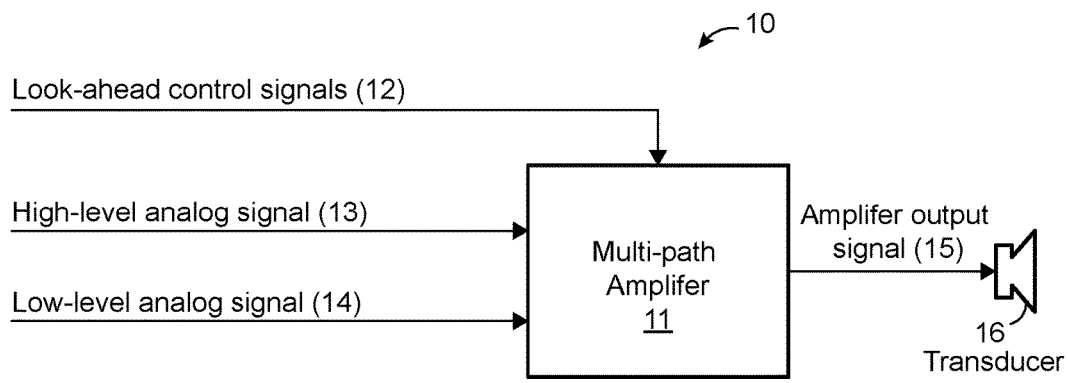
FIG. 1 illustrates a simplified block diagram of a multi-path amplifier of the present disclosure.
Figure 2:
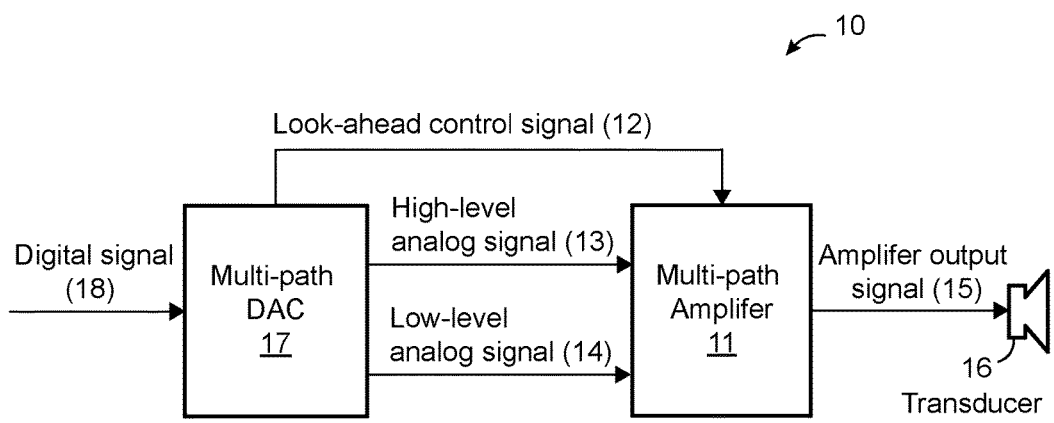
FIG. 2 illustrates a simplified block diagram of the multi-path amplifier of the present disclosure connected to a multi-path DAC.
Figure 3:
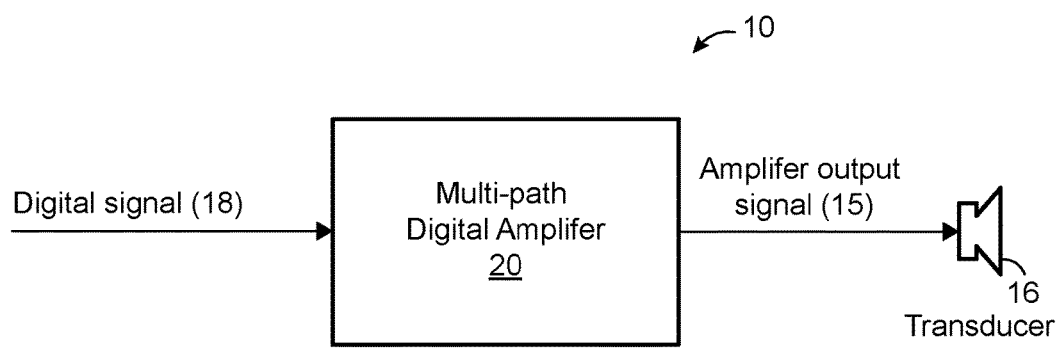
FIG. 3 illustrates a simplified block diagram of a multi-path digital amplifier of the present disclosure.
Figure 4:
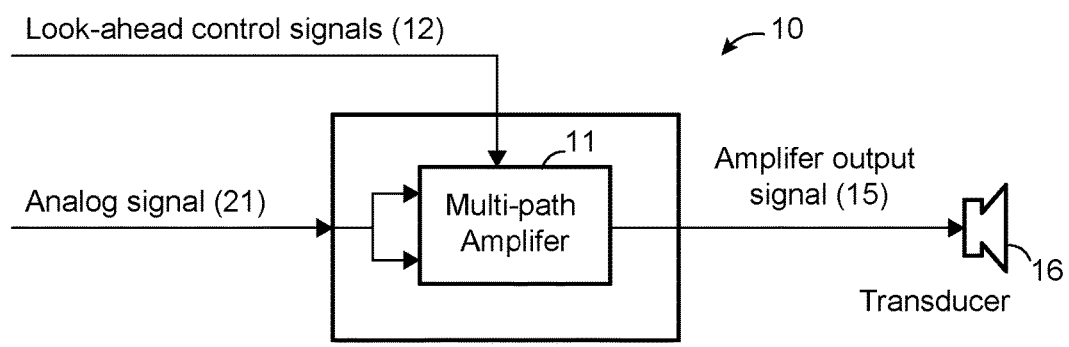
FIG. 4 illustrates a simplified block diagram of a multi-path amplifier of the present disclosure that accepts a single analog input signal.

FIG. 1 illustrates a simplified block diagram of a multi-path power amplifier system 10 utilizing a multi-path amplifier 11 that can be the basic building block for FIGS. 2-4. The multi-path amplifier 11 is illustrated receiving the look-ahead control signal 12, a high-level analog signal 13, and a low-level analog signal 14. The high-level analog signal 13 and low-level analog signal are "pre-adapted," each represent a portion, divided up by signal level range, of a wider dynamic range signal. The amplifier output signal 15 is shown driving a transducer 16 that converts electrical energy into mechanical vibration. For audio applications, the transducer can be a loudspeaker. The multi-path amplifier 11 is described in more detail in the discussion of FIGS. 5-10.

FIG. 2 illustrates a simplified block diagram of the multi-path power amplifier system 10 with the multi-path amplifier 11 in combination with a multi-path DAC 17 as the signal source for the multi-path amplifier 11. The multi-path DAC 17 receives a digital signal 18 and using a processor, DSP, or equivalent processing device, maps the bit-stream between multiple DACs (not shown) to create a high-level analog signal 13 and the low-level analog signal 14, and creates the look-ahead control signal 12. The high-level analog signal 13 and low-level analog signal are delayed in relation to the look-ahead control signal 12 to give the look-ahead control signal "pre-knowledge" of their levels. The look-ahead control signal 12, high-level analog signal 13, and low-level analog signal 14 feed the input of the multi-path amplifier 11. The amplifier output signal 15 feeds transducer 16. The multi-path DAC 17 is described in more detail in the discussion of FIGS. 11-14. The topology of FIG. 2 is described in more detail in the discussion of FIG. 15.

FIG. 3 illustrates a simplified block diagram of the multi-path power amplifier system 10 utilizing a multi-path digital power amplifier 20 of the present disclosure that is capable of utilizing a higher-portion of dynamic range of a digital signal than typical conventional digital audio amplifiers. The multi-path digital amplifier receives the digital signal 18 and using a DSP or equivalent processing device, maps the bit-stream between multiple DACs and amplifiers, or alternatively DAC/Amplifier combinations, and selectively amplifies the signals in order to optimize the dynamic range of amplifier output signal 15. The amplifier output signal 15 feeds the transducer 16. The multi-path digital power amplifier 20 is described in more detail in the discussion of FIGS. 16 and 17.

FIG. 4 illustrates a simplified block diagram of a multi-path power amplifier system 10 of the present disclosure that accepts an analog signal 21 along with a look-ahead control signal 12 that has "pre-knowledge" of the instantaneous signal level of the analog signal 21. Typically, both signals are generated by a DSP, or equivalent processor, where the analog signal 21 is delayed in relation to the look-ahead control signal 12 in order to give the look-ahead control signal 12 pre-knowledge of the level of the analog signal 21. The analog signal 21 is divided into multiple paths and feed into a multi-path amplifier 11, similar to FIG. 1, where the paths are selectively amplified according to pre-knowledge of the analog signal 21. The resulting amplifier output signal 15 feeds a transducer 16. FIG. 4 is discussed in more detail in the discussion of FIGS. 18 and 19.

Figure 5:
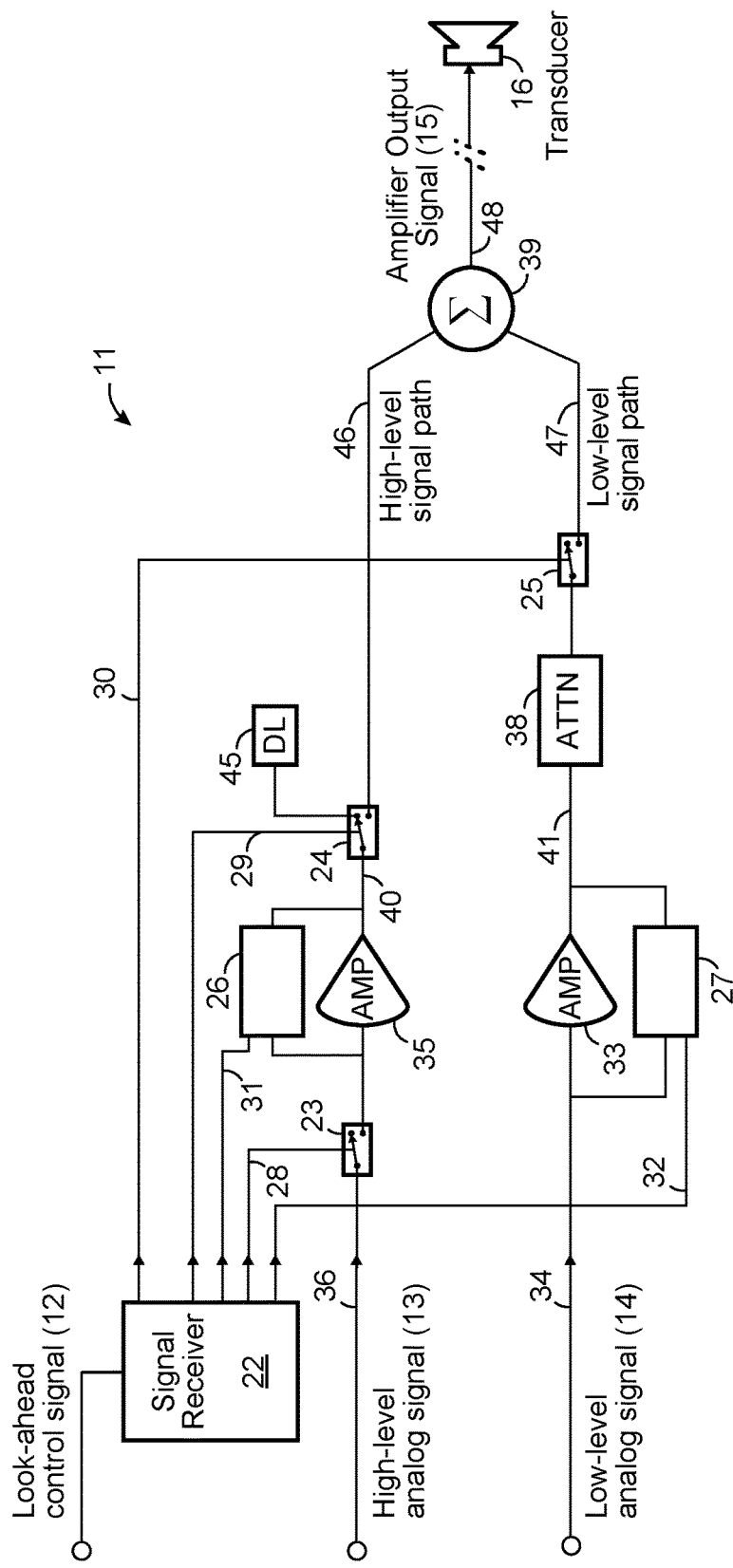
FIG. 5 illustrates the block diagram of FIG. 1 in greater detail.
Figure 6:
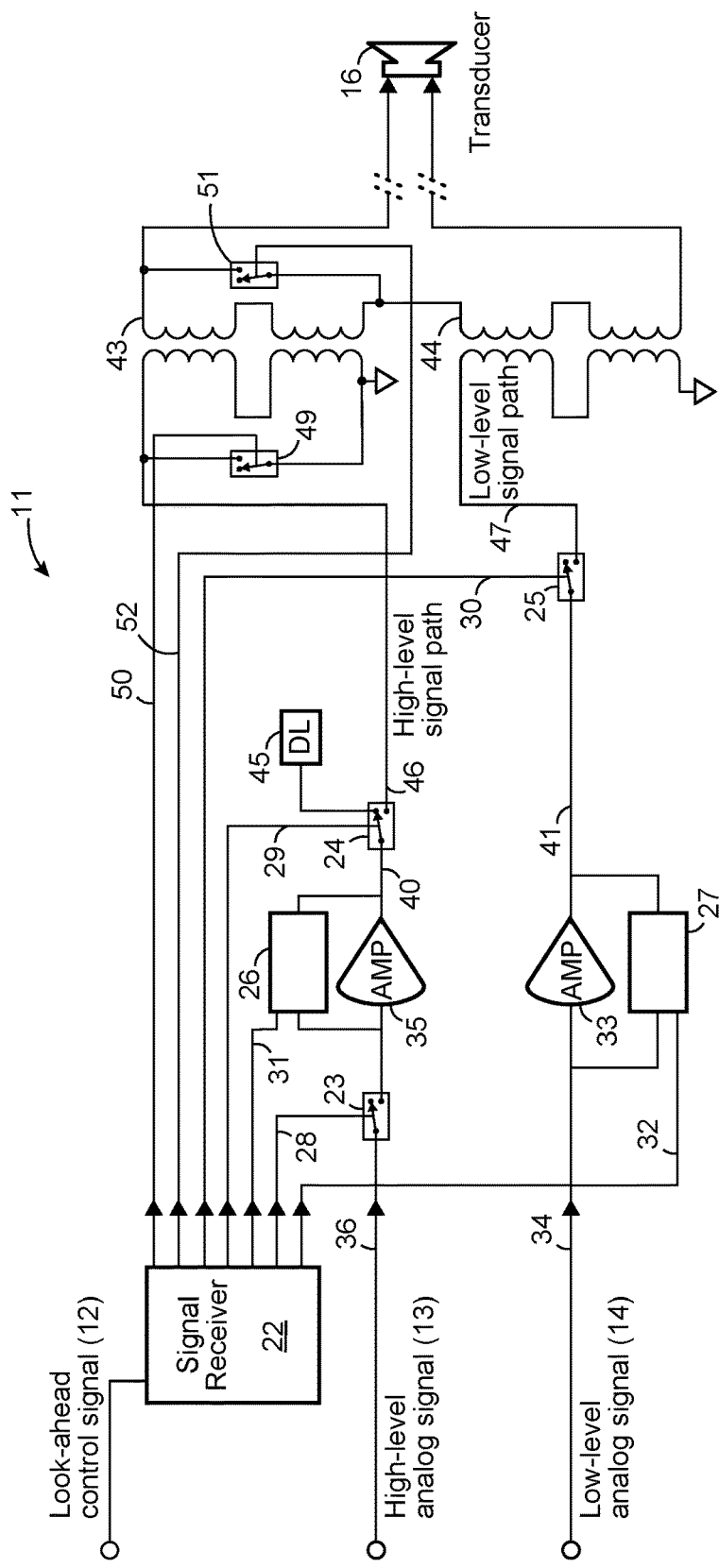
FIG. 6 illustrates the multi-path amplifier of FIG. 5 modified with a transformer coupled output stage.

FIGS. 5 and 6 show the multi-path amplifier 11 of FIG. 1 in more detail, with the differences between FIGS. 5 and 6 being the output signal handling. Referring to FIGS. 5 and 6, a signal receiver 22 receives and distributes the look-ahead control signal 12 to selectively control the on and off state of electronically controlled switches 23, 24, 25 and values of the gain elements 26, 27 via control signal paths 28, 29, 30, 31, 32 respectively. The low-level analog signal 14, the high-level analog signal 13, and the look-ahead control signal 12 are typically generated from a digital audio signal which can be located locally or remotely. The low-level analog signal 14 and high-level analog signal 13 are delayed with respect to the look-ahead control signal 12 which allows the look-ahead control signal 12 to control the electronically controlled switches 23, 24, 25, and gain elements 26, 27 with "pre-knowledge" of the signal levels of the low-level analog signal 14 and high-level analog signal 13.

The low-level analog signal 14 feeds an amplifier 33 through signal path 34. The high-level analog signal 13 selectively feeds an amplifier 35 through electronically controlled switch 23 and signal path 36. Amplifier 35 can be noise and signal optimized for a higher signal level range than amplifier 33. Because each amplifier 33, 35 can be noise and signal optimized for different signal ranges, they can selectively engage and amplify their respective signals to maximize dynamic range. For example, when the high-level analog signal 13 is not present, electronically controlled switch 23, 24 can disengage the input of amplifier 35 from signal path 36 and the output of the amplifier 35 from the high-level signal path 46. Optionally, the gain element 26 can be adjusted to minimize the gain of the amplifier 35. This can eliminate or significantly reduces the noise contribution of this amplifier 35 during low-level passages. On possible reason for this is the noise contribution of the amplifier 35 which is optimized to handle higher-level signals, may have significantly higher than the noise contribution of amplifier 33 that amplifies the low-level input. When the high-level analog signal 13 is not present on signal path 36, the analog signal is entirely present in the low-level analog signal 14 except when no signal is present. The low-level analog signal 14 flows through amplifier 33 and through attenuator 38 to the summing node 39 producing the amplifier output signal 15. Attenuator 38 is typically a passive attenuator such as a resistive voltage divider or transformer. The attenuator 38 can have a fixed attenuation value or can be electronically controlled, for example, an electronically controlled passive resistive ladder, or an electronically controlled motorized potentiometer. The attenuator can also be active; however, active attenuators will generally not have as low a self-noise as passive attenuators. In some applications, the self-noise of active attenuators may be acceptable. As the analog signal level begins to rise to a pre-determined threshold, the look-ahead control signal 12, with pre-knowledge of when the high-level analog signal 13 or low-level analog signal will be present 14, engages electronically controlled switches 23, 24 and adjusts gain element 26 typically within microseconds to a few milliseconds before the high-level analog signal 13 is present. The higher self-noise of amplifier 35 is now present on amplifier output signal 15, but masked by the higher signal level of the output signal. The transition between amplifiers 33, 35 can potentially happen quite rapidly depending on the nature of the signal source. Note that when engaging the electronically controlled switch 24 in consort with an upward transitional event, the amplifier 35 can be turned off or disabled until the electronically controlled switch 24 is fully engaged. Similarly, during a downward transition event, electronically controlled switch 24 can be held on/closed until the amplifier 35 is turned off or disabled, at which point the electronically controlled switch 24 can disengage the amplifier from the high-level signal path 46.

In FIG. 5, the high-level signal path 46 and the low-level signal path 47 can be passively summed via summing node 39. This may be resistive summing, transformer summing, or types of summing that are capable of handling the voltage, current, and power output of the amplifiers 33, 35. In FIG. 6, the high-level signal path 46 and the low-level signal path 47 are summed through transformers 43, 44. Referring to FIG. 5, the amplifier output path 40 selectively feeds the high-level signal path 46, through electronically controlled switch 24. When the amplifier 35 is not engaged by the electronically controlled switch 24 to high-level signal path 46, it can optionally feed to a dummy load 45. The amplifier output path 41 feeds attenuator 38. The high-level signal path 46 and the low-level signal path 47 selectively feed the summing node 39 via electronically controlled switches 24, 25 respectively. The amplifier output signal 15 drives the transducer 16 via signal path 48. Note the electronically controlled switch 25 can also be used to prevent current feedback from high-level signal path 46 into the amplifier output path 41.

In FIG. 6, the low-level signal path 47 selectively feeds the input side of transformer 44 via electronically controlled switch 25 from the amplifier output path 41. The high-level signal path 46 selectively feeds the transformer 43 via electronically controlled switches 24, 49. When the amplifier 35 engages the transformer 43, electronically controlled switch 24 engages the high-level signal path 46 while electronically controlled switch 49 does not engage the high-level signal path 46. Optionally, simultaneously the electronically controlled switch 24 can be engaged and the electronically controlled switch 49 can be disengaged immediately before a signal appears at 40. When the amplifier 35 is inactive, the electronically controlled switch 24 optionally engages the dummy load 45 and electronically controlled switch 49 shorts the high-level signal path 46 to ground across the input of the transformer 43 via control signal path 50. Electronically controlled switch 51 can optionally selectively shunt the output of the transformer via controls signal path 52. The outputs of transformers 43, 44 feed the transducer 16. Alternatively, in a differential signal path, the transformers 43, 44 can be driven differentially and electronically controlled switch 49 can be placed across the differential input signal.

Figure 7:
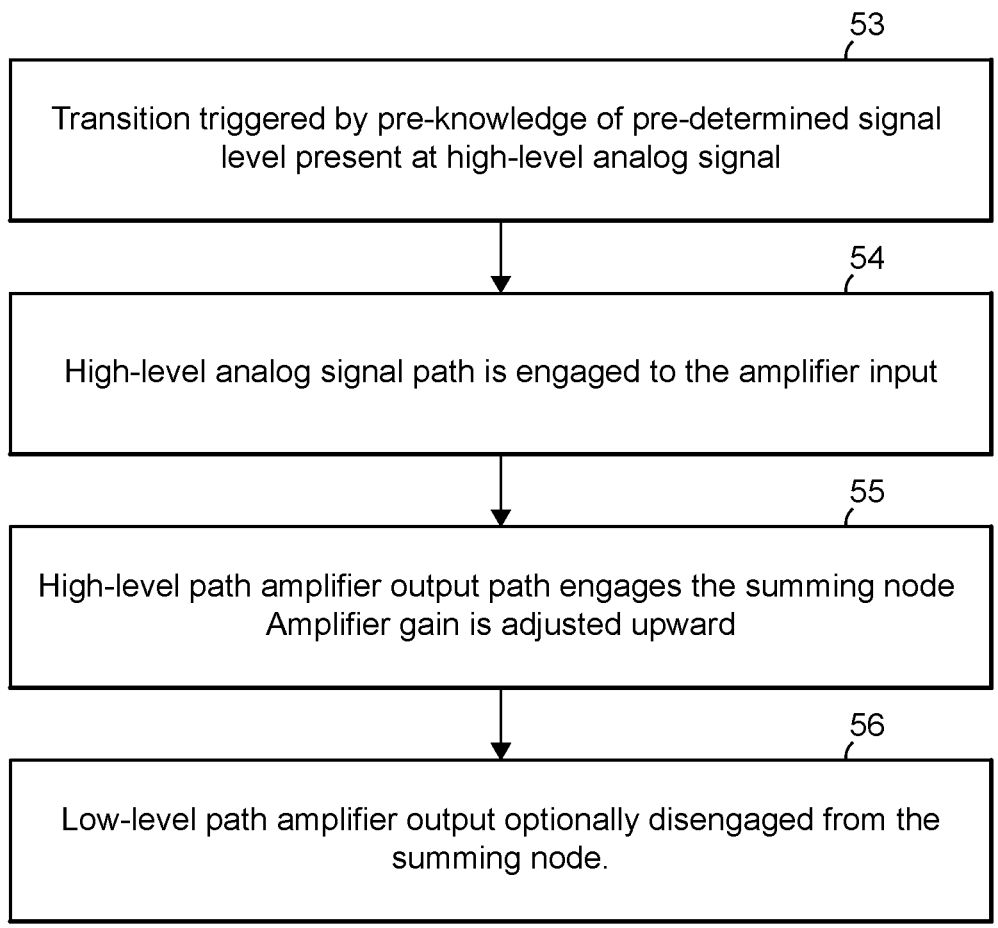
FIG. 7 illustrates a process flow diagram of the multi-path amplifier of FIG. 5 for a signal transitioning from low-level to high-level.

FIG. 7 shows a typical process for transitioning from the low-level signal path 47 to a high-level signal path 46 of FIGS. 5 and 6. Referring to FIG. 7 and FIG. 5, where the steps refer to FIG. 7, and the other elements refer to FIG. 5, in step 53, the transition period is triggered by pre-knowledge of a pre-determined signal level present at the high-level analog signal 13. The gain of amplifier 35 remains very low or off via gain element 26. In step 54, the electronically controlled switch 23 engages the path of the high-level input signal into the amplifier 35. In step 55, the amplifier output path 40 can be fed into the high-level signal path 46. This can be accomplished by engaging the electronically controlled switches 23, 25 or alternatively by engaging the electronically controlled switches 23, 25 in combination with increasing the gain of gain element 26 in any manner in order to optimize performance (i.e. a linear, glitch-free and perceptively uniform signal output). The self-noise of the amplifier 35 is now injected into the summing node 39, however, the analog signal present on the low-level signal path 47 is of sufficient level to mask the self-noise of the amplifier 35. For example, for an audio signal, the noise would be psychoacoustically masked by the listener. In step 56, the amplifier output path 41 is optionally removed from the summing node 39 by electronically controlled switch 25.

Figure 8:
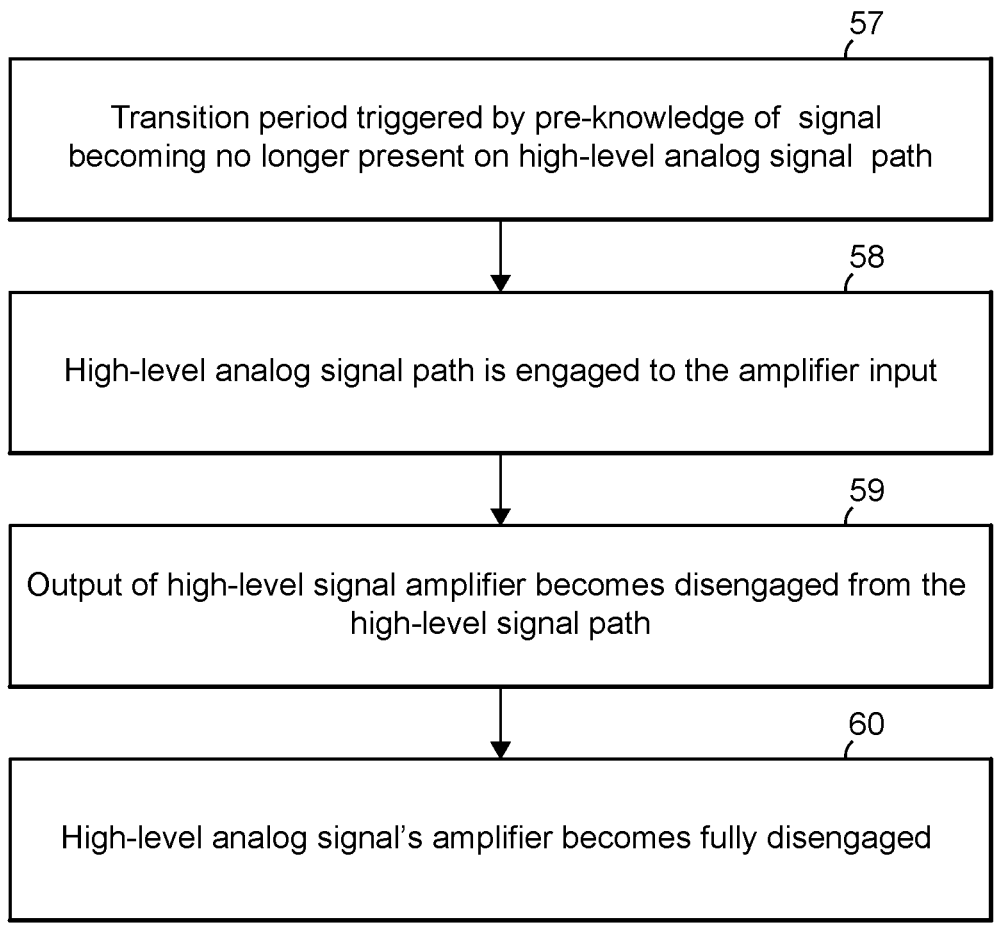
FIG. 8 illustrates a process flow diagram of the multi-path amplifier of FIG. 5 for a signal transitioning from high-level to low-level.

For the opposite or downward transition of selectively amplifying the transition from a high-level analog signal 13 to a low-level analog signal 14 the steps 53, 54, 55, 56 are essentially reversed. Referring to FIG. 8 and FIG. 5, where the steps refer to FIG. 8, and the other elements refer to FIG. 5, in step 57, the transition period is triggered by pre-knowledge of the signal level becoming no longer present at the high-level analog signal 13 or some similar pre-determined signal level criteria. In step 58, the amplifier output path 41 is fully engaged with the low-level signal path 47. This is accomplished by engaging the electronically controlled switch 25. The gain element 27 is transitioned upward to nominal gain, via control signal path 32. In step 59, the output of the high-level signal path 46 is disengaged by electronically controlled switch 24 and the gain of amplifier 35 set by gain element 26 is minimized. In step 60, the high-level analog signal 13 is disengaged from the input of amplifier 35 by electronically controlled switch 23.

Throughout this disclosure, the signal receiver 22 can receive wired or wireless signals from a local or remote device. Examples of suitable wired receivers include, but are not limited to, USB, Thunderbolt, or Ethernet. Examples of suitable wireless receivers include, but are not limited to, Wi-Fi (for example, 802.11b, 802.11g, 802.11n, and 802.11ac), Bluetooth, wireless USB, and ZigBee. The signal receiver can be a dedicated device, a microcontroller, a programmable logic device such as an FPGA, or any device capable of receiving the previously described range of signals.

Figure 9:
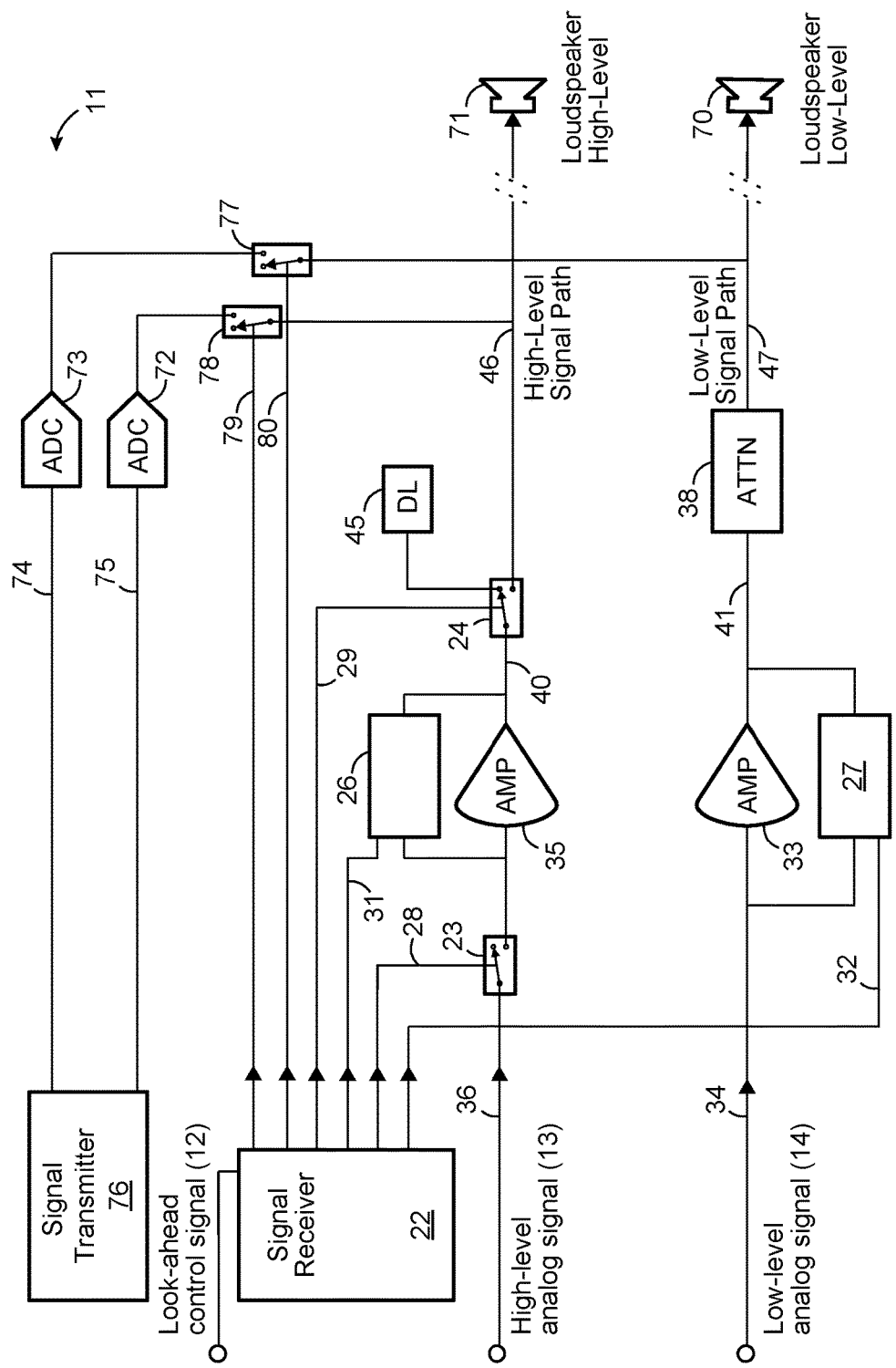
FIG. 9 illustrates an alternative multi-path amplifier of FIG. 1 with a high-level signal output engaging a transducer optimized for high-level output signals and a low-level signal output engaging a transducer optimized for low-level output signals.
Figure 10:
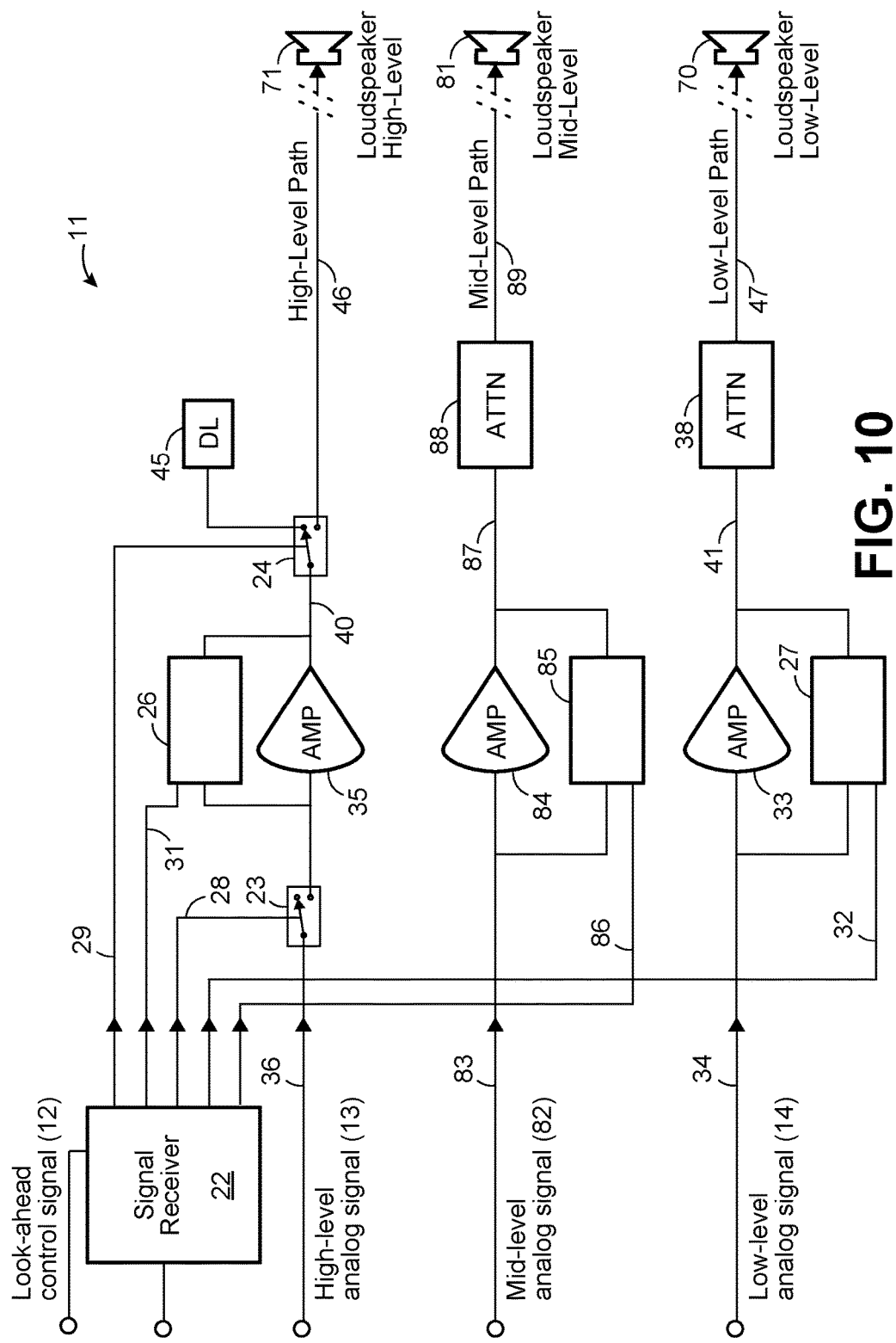
FIG. 10 illustrates an alternative multi-path amplifier of FIG. 1 with a high-level signal output engaging a transducer optimized for high-level output signals, a mid-level signal output engaging a transducer optimized for mid-level signals, and a low-level signal output engaging a transducer optimized for low-level output signals.

The multi-path power amplifier system 10 of FIGS. 1, 5, and 6 show an amplifier output signal 15 powering a transducer 16. The inventor discovered that the structure of the multi-path power amplifier affords the possibility of powering multiple transducers, each according to a specific range of levels. FIG. 9 illustrates an alternative version of the multi-path amplifier 11 of FIG. 1 with a high-level signal output engaging a transducer optimized for high-level output signals and a low-level signal output engaging a transducer optimized for low-level output signals. FIG. 10 illustrates how this concept can be extended to three outputs, with the topology of FIG. 10 being extendable to more than three outputs if required. In FIG. 10, the multi-path amplifier 11 includes a high-level signal path 46 engaging a transducer 71 optimized for high-level output signals, a mid-level signal path 89 engaging a transducer 81 optimized for mid-level signals (i.e. lower than the signal level range of the high-level signals and higher than the signal level range of low-level signals), and a low-level signal path 47 engaging a transducer 70 optimized for low-level output signals.

Referring to FIG. 9, the high-level analog signal 13, low-level analog signal 14, signal paths 34, 36, the electronically controlled switches 23, 24, gain elements 26, 27, amplifiers 33, 35, amplifier output paths 40, 41, attenuator 38, dummy load 45, look-ahead control signal 12, signal receiver 22, and control signal paths 28, 29, 31 interact as described for FIGS. 5, 7, and 8. However, instead of summing the high-level signal path 46 and the low-level signal path 47 together, the high-level signal path 46 directly feeds the transducer 71 and the low-level signal path 47 directly feeds the transducer 70. The transducers 71, 70 are optimized for different signal level ranges, with transducer 71 optimized for a higher-level signal range than transducer 70. Note that in FIG. 9, transducer 71, 70 are labeled as loudspeakers. As in other examples, given in this disclosure, transducers can be loudspeakers or other devices capable of translating electrical energy into mechanical vibration. While the transducers 71, 70 are shown as separate transducers, they may in fact be packaged as one transducer with separately responding transducer elements. Moreover, the single transducer symbol is used for clarity. In practice, a transducer may be comprised of multiple loudspeakers, crossover network(s), and other related components.

FIG. 9 lacks the electronically controlled switch 25 of FIG. 5 and demonstrates how this electronically controlled switch 25 is an optional element. In FIG. 9, when no signal is present on both the transducers 70, 71, the gain element 27 can minimize the gain of amplifier 33 to minimize the self-noise of amplifier 33 present at transducer 70. When transducer 71 is active, but transducer 70 is inactive, the signal level present at transducer 71 will mask the self-noise of amplifier 33 present at transducer 70.

FIG. 9 demonstrates optional calibration feedback to an upstream device or circuit that is responsible for either generating or managing the look-ahead control signal 12 and/or high-level analog signal 13 and low-level analog signal 14. The calibration feedback illustrated includes analog-to-digital converters (ADCs). The ADCs 72, 73 are fed the voltage level values of the high-level signal path 46 and the low-level signal path 47, respectively. The voltage value of the high-level signal path 46 is selectively fed to the ADC 72 through electronically controlled switch 78. The voltage value of the low-level signal path 47 is selectively fed to the ADC 73 through electronically controlled switch 77. Electronically controlled switches 77, 78 are controlled by the signal receiver 22 through the control signal paths 80, 79 respectively. The ADC output signals 74, 75 feed a signal transmitter 76. The signal transmitter can provide wired or wireless transmission to a local or remote device. Examples of suitable wired transmitters include USB, Thunderbolt, or Ethernet. Examples of suitable wireless transmission include Wi-Fi (for example, 802.11b, 802.11g, 802.11n, and 802.11ac), Bluetooth, wireless USB, and ZigBee. The signal transmitter can be a dedicated device or a microcontroller or any device capable of transmitting the previously described range of signals. The signal transmitter could be combined with the signal receiver 22 and implemented as a transceiver.

The output of the ADCs 72, 73 are used by the upstream device to measure the actual output signal levels of the high-level signal path 46 and the low-level signal path 47 and make level compensation adjustments based on a comparison of stored, measured, pre-defined, or otherwise expected reference levels with actual measured levels. These compensation adjustments help compensate for variations in output signal levels of the high-level signal path 46 and the low-level signal path 47 from external variables such as loudspeaker or transducer impedances. The compensation adjustment process is described in more detail in the discussion of FIG. 16.

FIG. 10 illustrates the concept of selectively engaging three or more amplifiers, each optimized for a different signal range, according to signal level. FIG. 10 demonstrates, for more than two signals, noise managing a higher signal level paths and attenuating lower signal level paths. In the case, the high-level signal path 46 is noise managed. The mid-level signal path 89 and low-level signal paths are attenuated by attenuators 88, 38 respectively. The selectively engaged amplifiers feed transducers that are also optimized for that signal level range they are being fed. While three input and output paths are shown, the concept can be extended to any number of input and output paths. In FIG. 10, amplifier 35 feeds transducer 71 via the high-level signal path 46 through electronically controlled switch 24. Amplifier 84 feeds transducer 81 via the mid-level signal path 89 through attenuator 88 from amplifier output path 87. Amplifier 33 feeds transducer 70 via the low-level signal path 47 through attenuator 38 via amplifier output path 41. The look-ahead control signal 12 feeds the signal receiver 22 by wireless or wired transmission as previously described. The control signal paths 28, 29, 31, 32, 86 selectively engage the electronically controlled switches 23, 24, and controls the gain elements 26, 27, 85 respectively, in a manner and sequence previously described for FIG. 5, except for the addition of the gain element 85 and the removal of electronically controlled switch 25 of FIG. 5.

The wide dynamic range analog signal has been preconditioned so that it transmits along multiple signal paths according to signal level range as previously discussed. In one embodiment, during transition periods, the analog signal is preconditioned so that the high-level analog signal 13, the mid-level analog signal 82, and the low-level analog signal 14 can be mutually exclusive. For example, if the signal is present in signal path 34, it would not be present in signal path 83 unless a transition was occurring, and the preconditioned analog signal would not be present on signal path 36. Similarly, if the preconditioned analog signal was present on signal path 83, it would not be present on signal path 36 unless the signal level was transitioning upward and would not appear on signal path 34 unless the signal was transitioning downward. In other embodiments, it is possible for the high-level analog signal 13, the mid-level analog signal 82, and the low-level analog signal 14 all be present at same time with the signal levels adjusted so that the sum of the three signals is a linear representation of original signal. As previously discussed, the look-ahead control signal 12 has pre-knowledge of when the signal transition will occur and crossfade the amplifier gains and switch in and out the appropriate amplifiers in order to avoid glitches, distortion, and other non-linearities.

The gain elements 26, 27, 85 associated with amplifiers 35, 33, 84 respectively, along with electronically controlled switches 23, 24 act in consort to adapt the multi-path amplifier 11 of FIG. 10 to dynamically optimize output dynamic range according to the input signal level. When the preconditioned analog signal is not present on signal paths 36, 83, 34, the input of the amplifier 35 is disengaged from signal path 36 by electronically controlled switch 23 and the amplifier output path 40 is disengaged from the high-level signal path 46. The amplifier output path 40 can optionally feed a dummy load 45. The gain of amplifiers 35, 84, and optionally the amplifier 33 are set to minimum by gain elements 26, 85, 27 respectively. This eliminates the self-noise of the amplifier 35 from reaching the transducer 71 and minimizes the self-noise of amplifier 84 at transducer 81 and the self-noise of amplifier 33 from reaching the transducer 70. When the low-level analog signal 14 is about to become present on signal path 34, the look-ahead control signal 12 will adjust the gain of amplifier 33 to nominal level by gain element 27 through control signal path 32. Similarly, when the mid-level analog signal 82 is about to become present on the signal path 83, the look-ahead control signal 12 crossfades the mid-level analog signal 82 upward and the low-level analog signal 14 downward. The look-ahead control signal 12 will adjust the gain of amplifier 84 to nominal level by gain element 85 through control signal path 86. At the same time, the look-ahead control signal 12 will adjust the gain of amplifier 33 to a minimum through gain element 27 and control signal path 32. As previously described, this transition period typically ranges from microseconds to a few milliseconds. If the preconditioned signal is about to rise at an especially fast rate from the low-level analog signal 14 to the high-level analog signal 13 the transition may bypass completely or near-completely the mid-level signal path 89 and transition directly from low-level signal path 47 to high-level signal path 46.

When the mid-level analog signal 82 is present on signal path 83 and the high-level analog signal 13 is about to be present on signal path 36, the look-ahead control signal will engage the amplifier 35 by engaging the electronically controlled switches 23, 24 and then crossfading the gain of amplifier 35 and amplifier 84. Control signal paths 28, 29, 31, and 86 are used to control the crossfade. When transitioning downward from a high-level signal path 46 to a low-level signal path 47 through the mid-level signal path 89, the sequence above can be performed in reverse order.

To aid in the understanding of a possible upstream device for creating a preconditioned signal for the multi-path amplifier 11 of FIGS. 5, 6, 9 and 10 and throughout the remainder of this disclosure, FIGS. 11-14 present the multi-path DAC 17 of the inventor, in a simplified form. The multi-path DAC 17 is the subject of the inventor's U.S. Pat. No. 9,590,648 issued on Mar. 7, 2017. Conventional wisdom believes that a limiting performance factor of a DAC is its self-noise. The inventor discovered, that contrary to this conventional wisdom, it is possible create a DAC with significantly higher dynamic range by parsing a digital signal into two or more ordered bit-groupings representing particular sets of signal level ranges and processing each bit-grouping by separate DAC circuits. Each bit group is mapped to a separate DAC. Some of the DAC's lower bits may be below the DAC's noise-floor and not usable. Each bit-grouping is mapped to its respective DAC to a range of bits above the DAC's noise-floor so that all bits within the bit group are usable. The output signal of a particular DAC, in a particular DAC path, is either amplified, passed-through, or attenuated so that resultant analog signals from all the DACs, when summed, represent a linearly amplified version of the digital signal.

Figure 13:
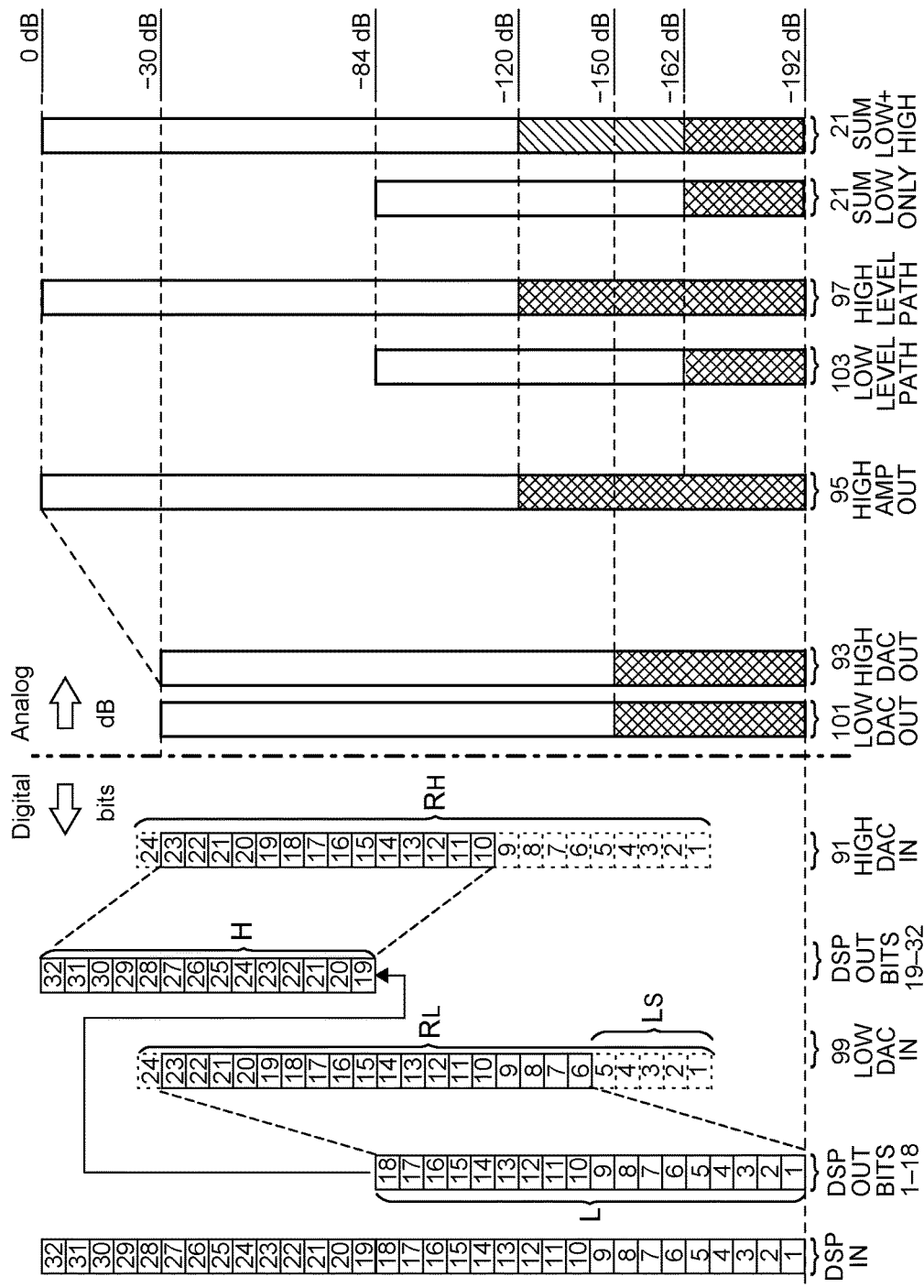
FIG. 13 illustrates a signal level diagram for FIG. 11.
Figure 14:
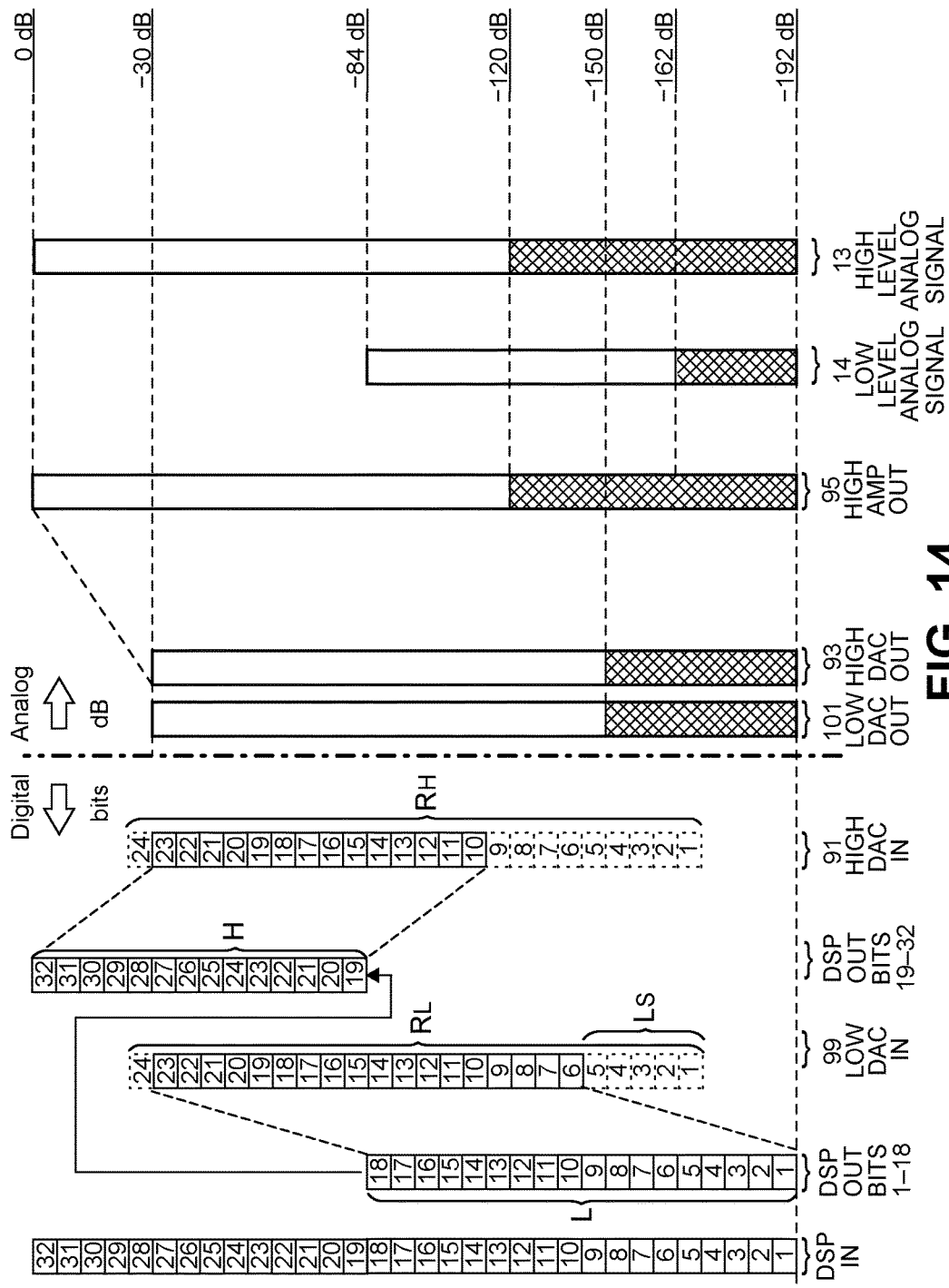
FIG. 14 illustrates a signal level diagram for FIG. 12.

FIG. 11 illustrates a simplified block diagram of a multi-path DAC 17 with analog signal 21 creating by summing the high-level path 97 and the low-level path 103 by a summing node 98. FIG. 12 illustrates a simplified block diagram of a multi-path DAC 17 with multi-path analog outputs that can include a high-level analog signal 13 and a low-level analog signal 14 instead of the summed output of FIG. 11. The analog signal 21 in combination with the look-ahead control signal 12 of FIG. 11 could be the signal source for the multi-path amplifier 11 of FIG. 18. The high-level analog signal 13 and the low-level analog signal 14 of FIG. 12, in combination with the look-ahead control signal 12, could be a signal source for the multi-path amplifier 11 of FIGS. 5 and 6. FIG. 13 illustrates an example of a signal level diagram for FIG. 11 showing a particular bit-grouping. FIG. 14 illustrates a signal level diagram for FIG. 12 using the same bit-grouping as FIG. 13 for simplicity. Note that this bit-grouping, bit mapping, dynamic range, gains, and attenuations are for illustrative purposes to aid the reader in understanding how the multi-path DAC 17 works. There are many combinations of bit-groupings, number of bit-groupings, bit mapping, dynamic range, signal bit widths, gains, and attenuations that are within the scope of the multi-path DAC 17. Referring to FIGS. 11 and 12, DSP 90 can parse a digital signal 18 into two bit-groupings. A grouping of lower-order bits is transmitted along a signal path 99 to a DAC 100 and from DAC 100 to a attenuator 102 through signal path 101. A grouping of higher-order bits is transmitted along a signal path 91 to a DAC 92, from the DAC 92 to amplifier 94 through signal path 93, and from the amplifier 94 to the high-level path 97 in FIG. 11 or to the high-level analog signal 13 in FIG. 12. The DAC 100 and attenuator 102 can be noise and signal level optimized for a signal level range associated with the grouping of lower-order bits. The DAC 92, amplifier 94 can be noise and signal level optimized for the higher-order bits. The bit-groupings on the signal path 99 and the signal path 91 may be contiguous, overlapped, appended, or crossfaded in relation to each other.

Referring to FIGS. 13 and 14, the left-hand-side of the figures show an example of how the DSP 90 of FIGS. 11 and 12, can map a 32-bit signal into two 24-bit DAC 92, 100. As previously mentioned, the use of a particular signal width (i.e. 32-bit signal) or resolution of the DAC 92 (i.e. 24-bits) is merely for the convenience of the reader. Other signal widths, DAC resolutions, bit-groupings, bit mappings, and dynamic ranges are well within the scope of the multi-path DAC 17. The right-hand scale shows relative dB levels for the analog signal levels, with the hatched portions of the level bars representing noise. The scale of 0 dB to −192 dB represents the potential dynamic range of a 32-bit signal source such as the digital signal 18 of FIGS. 11 and 12. Referring to the left-hand side of FIGS. 13 and 14, the 32-bit signal, labeled "DSP IN" can be parsed by the DSP 90 of FIGS. 11 and 12, into an 18-bit path that includes lower bit nos. 1-18, and a 14-bit path that includes higher bits nos. 19-32. In FIGS. 13 and 14, DAC 100 and DAC 92 can be both 24-bit DACs. The lower bits nos. 1-18, labeled "DSP OUT BITS 1-18," are mapped to bits nos. 6-23 of DAC 100. The higher-order bits nos. 19-32, labeled "DSP OUT BITS 19-32," are mapped to bits nos. 10-23 of DAC 92. The DSP 90 typically maps the low-path signals by multiplying them upward. Contemporary high performance 24-bit integrated circuit based audio DACs can have an analog dynamic range of roughly 120 dB. Since a 24-bit signal potentially has 144 dB of dynamic range, this essentially means that 24 dB or 4-bits of information are lost in the self-noise of the DAC. Mapping lower bit nos. 1-18 of the 32-bit signal to bit nos. 6-23 of DAC 100 raises the lowest usable program information above the DAC's noise-floor.

Referring to FIGS. 11 and 12, in order to correctly represent the 32-bit signal using two 24-bit DACs with the 32-bit signal mapped into an 18-bit path and 14-bit path, low-level path 103 must be lower than the high-level path 97 by 84 dB because the high-level path 97 represents the upper 14-bits, or upper 84 dB of the 32-bit signal. Referring to FIGS. 11-14, amplifier 94 (FIGS. 11 and 12), in this example, has approximately 30 dB of gain ("HIGH AMP OUT" of FIGS. 13 and 14). Taking into account the attenuator 102 attenuates the low-level path 103 by 54 dB, which would be 84 dB below the high-level path output. In FIGS. 13 and 14, the bar labeled "LOW-LEVEL ANALOG SIGNAL" is attenuated from −30 dB to −84 dB or by 54 dB.

In FIGS. 13 and 14, the difference between the full-potential minimum level of a 32-bit signal, −192 dB from maximum, and the noise-floor at the signal paths 93, 101 of the DAC outputs, which is −150 dB from maximum, is shown by the hatched areas of the bar labeled "LOW DAC OUT" and "HIGH DAC OUT." The bar labeled "HIGH AMP OUT," reflects the 30 dB gain in amplifier 94 discussed in the previous paragraph. The maximum output level of 0 dB (i.e. the top of the scale) and a noise-floor of −120 dB, both 30 dB higher than bar labeled "HIGH DAC OUT."

Referring back to FIGS. 11 and 12, because the grouping of low-order bits of the digital signal 18 has been multiplied upward by DSP 90, the analog output of DAC 100 can exhibit a level that is not representative of the digital signal 18. As previously discussed, to correct this, the attenuator 102 receives the output signal of the DAC 100 through signal path 101 and attenuates it on the low-level path 103 (FIG. 11) or low-level analog signal 14 (FIG. 12) to a level representative of the digital signal 18. The components within the dashed box 105 including DAC 92 and amplifier 94 can be under control of the DSP 90 through control signal path 95 in order to reduce noise in the high-level path 97. For example, the gain of the amplifier 94 can be selectively controlled, or the input and output of the amplifier 94 can be selectively switched in or out of the high-level path 97 in a manner similar to that described for the multi-path amplifier 11 of FIG. 5. The DSP 90 manages signal path transitions between the bit-mapped paths. Transitions can be contiguous, appended, crossfaded, layered, summed multiple active paths, or by any other path-to-path transition that maintains what a listener will perceive to be a linear, artifact-free and glitch-free analog output signal before, during, and after transitions.

The attenuation of the low-level path 103 by attenuator 102 of FIG. 11, is reflected in FIG. 13 by the bar labeled "LOW-LEVEL PATH." Similarly, the attenuation of the low-level analog signal 14 in FIG. 12 is reflected in FIG. 14 by the bar labeled "LOW-LEVEL ANALOG SIGNAL." As previously discussed, in FIG. 13, the signal path 101 of FIG. 11 has been sufficiently attenuated so that the maximum output level of the low-level path 103 sits 84 dB below the maximum output level of the high-level path 97 of FIG. 11. The maximum output level of the low-level path 103 of FIG. 11 represents the most significant bit (MSB) of the lower grouping of bits of digital signal 18. The maximum output level of the high-level path 97 of FIG. 11 represents the MSB of the higher grouping of bits of digital signal 18. Similarly, in FIG. 14, the signal path 101 of FIG. 12 has been sufficiently attenuated so that the maximum output level of the low-level analog signal 14 sits 84 dB below the maximum output level of the high-level analog signal 13 of FIG. 12. The reader will recall from the previous paragraph, in the current example, that the lower 18-bits must be shifted down by 84 dB in order for the resulting analog signal to represent a linear version of the digital input signal. The noise-floor of "LOW-LEVEL PATH" of FIG. 13 and the "LOW-LEVEL ANALOG SIGNAL" of FIG. 14 sits at −162 dB below the maximum signal output level. With the signals now properly amplified or attenuated, their sum creates a linear version of the input signal and the DSP 90 (FIGS. 11 and 12) can selectively engage the high-level path 97 (FIGS. 11 and 14), or the high-level analog signal 13 (FIGS. 12 and 14), only when a high-level signal is imminent. Without the high-level path 97 (FIGS. 11 and 13) or the high-level analog signal 13 (FIGS. 12 and 14) engaged, the noise-floor of a low-level signal is the noise-floor of the low-level path 103 (FIGS. 11 and 13) or the low-level analog signal 14 (FIGS. 12 and 14). This gives the system an effective dynamic range that is determined by the noise of the low-level path 103 (FIGS. 11 and 13) or the low-level analog signal 14 (FIGS. 12 and 14), which in this example is 162 dB.

Figure 15:
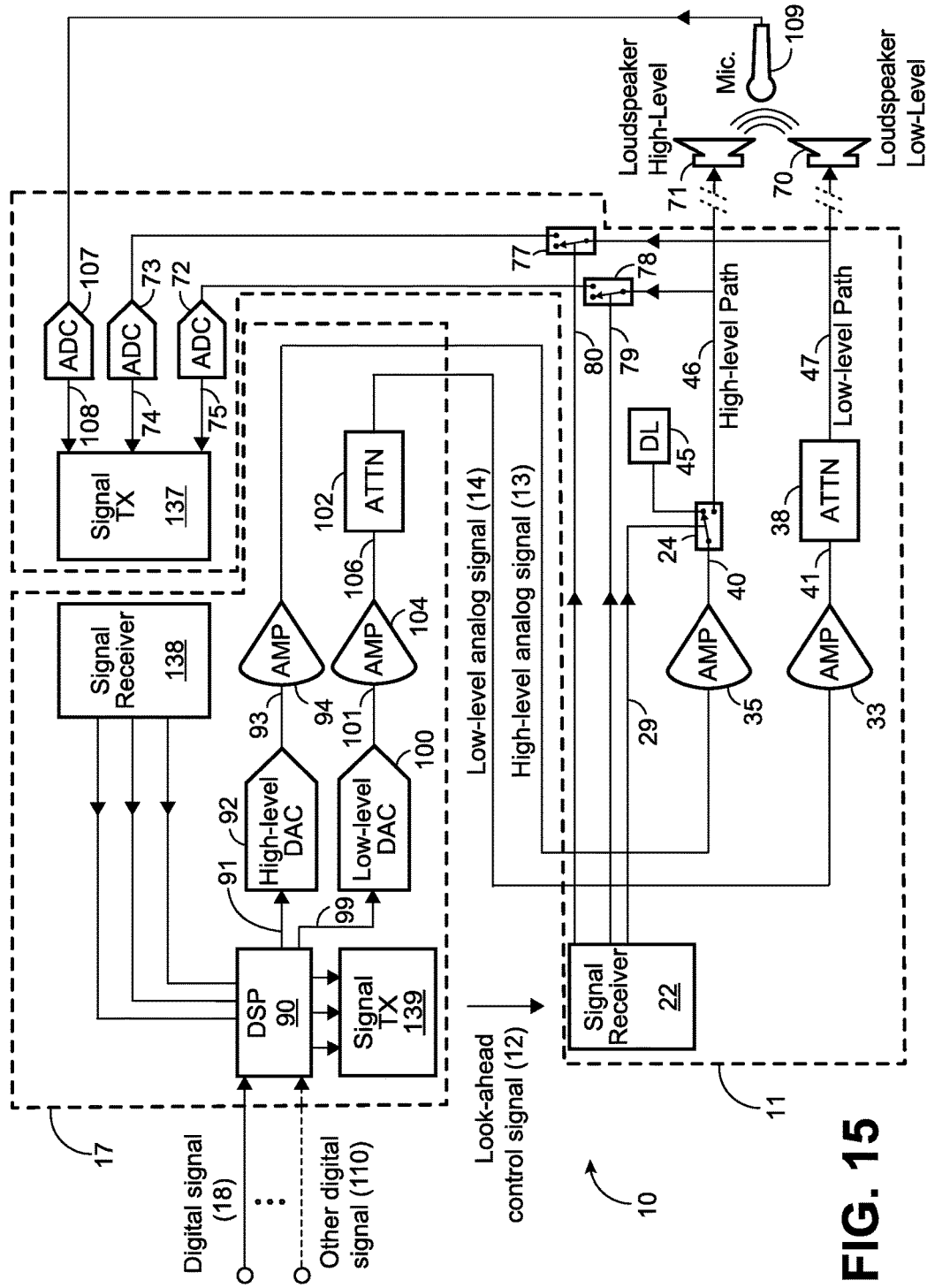
FIG. 15 illustrates the block diagram of FIG. 2 in more detail.

FIG. 15 illustrates the block diagram of FIG. 2 in more detail. The multi-path power amplifier system 10 is illustrated with a multi-path DAC 17 similar to FIG. 12 except for the addition of amplifier 104 along the signal path 101, in combination with a multi-path amplifier 11 similar to FIG. 9. The DSP 90 receives the digital signal 18 or other digital signals 110 in combination with the digital signal 18. The DSP 90 parses or maps the digital signal 18, or the combination, into bit-groupings with a first bit-grouping of higher-order bits is routed to DAC 92 via signal path 91 and a second bit-grouping of lower-order bits is routed to DAC 100 via signal path 99 as previously described. The output of the DAC 92 is routed to the amplifier 94 via signal path 93. The output of amplifier 94 is the high-level analog signal 13. The output of DAC 100 is routed through amplifier 104 through the signal path 101. The output of amplifier 104 is routed to attenuator 102 through the signal path 106. The output of the attenuator 102 creates the low-level analog signal 14. The gain and optionally, the on/off state of the amplifiers 94, 104 can be controlled by the DSP 90. For simplicity, gain blocks and control signals are not shown. As described in more detail in FIGS. 11-14, DAC 92, amplifier 94 and the gain of amplifier 94 together can be noise and signal optimized for the higher-order bits. The DAC 100, amplifier 104, the gain of amplifier 104, and attenuator 102 are noise and signal optimized for the lower-level bits.

The multi-path amplifier 11 of FIG. 15 is shown identically as the multi-path amplifier 11 of FIG. 9 except the gain elements 26, 27 and the control signal paths 31, 32 of FIG. 9 are excluded for simplicity. The multi-path amplifier 11 of FIG. 15 includes amplifier 35 which receives the high-level analog signal 13 from the multi-path DAC 17. The amplifier output path 40 is selectively routed through the electronically controlled switch 24 to either the dummy load 45 or to the high-level signal path 46. The high-level signal path 46 is routed to the transducer 71. Transducer 71 is illustrated as a loudspeaker optimized for the signal level range of the high-level signal path 46. The amplifier 33 receives the low-level analog signal 14 from the multi-path DAC 17. The amplifier output path 41 is received by the attenuator 38 which in turn produces the low-level signal path 47. The low-level signal path 47 drives the transducer 70. The transducer 70 is illustrated as a loudspeaker that is optimized for the signal level range produced by the low-level signal path 47. The gain of the amplifiers 33, 35, and the routing of the amplifier output paths 40 to the high-level signal path 46 is controlled by the DSP 90 through the signal transmitter 139 and the signal receiver 22. The signal transmitter 139 and the signal receiver 22 can be wired interfaces transmitting wired controlled signal via protocol such as USB, Thunderbolt, or Ethernet, or can alternatively be wireless interfaces transmitting wireless signals via wireless protocol such as Wi-Fi (802.11a, 802.11b, 802.11g, 802.11n, 802.11ac, etc.), wireless USB, or Bluetooth. Because the high-level analog signal 13 and the low-level analog signal 14 are delayed as compared with the digital signal 18, the DSP 90 can generate the look-ahead control signal 12 with pre-knowledge of the signal levels present at the input of the amplifiers 33, 35. Therefore, the DSP 90 can selectively route the low-level analog signal 14 and high-level analog signal 13 according to pre-knowledge of their signal levels to optimize dynamic range and to reproduce a faithful reproduction of the digital signal 18.

In order to aid in optimizing a faithful linear reproduction of the digital signal 18, ADCs 72, 73 are employed to help calibrate the output signal levels. The signal levels of the high-level signal path 46 and the low-level signal path 47 are selectively routed to ADCs 72, 73 via electronically controlled switches 78, 77 respectively. Electronically controlled switch 78 is controlled by control signal path 79 and electronically controlled switch 77 is controlled by control signal path 80. These signal paths are routed from the signal receiver 22 which receives control signals from the DSP 90 through the signal transmitter 139. A microphone 109, or other receiver, can optionally be used to provide additional calibration through ADC 107. The ADC output signals 75, 74, 108 from ADCs 72, 73, 107, respectively, are routed to a signal transmitter 137 which in turn can be received by the DSP 90 via a signal receiver 138. The signal transmitter 137 and the signal receiver 138 can be wired or wireless as previously discussed.

The following is a typical calibration sequence. The DSP 90 generates a low-path reference signal which feeds the low-level analog signal 14. The electronically controlled switch 77 is selectively engaged by the DSP 90 via control signal path 80 so that the ADC 73 receives a representation of the of the low-path reference signal. The DSP 90 compares the difference between the reference level and the measured level and creates a correction factor that is applied to the signal path 99. After the low-path calibration sequence is complete, the DSP 90 turns off its low-path reference signal and turns on a high-path reference signal which feeds the high-level analog signal 13. The electronically controlled switch 78 is selectively engaged by the DSP 90 via control signal path 79 so that the ADC 72 receives a representation of the of the high-path reference signal. The DSP 90 compares the difference between the reference level and the measured level and creates a correction factor that is applied to the signal path 91. After this high-path calibration is complete, the DSP 90 turns off its high-path reference signal and returns electronically controlled switches 77, 78 to their off (open) positions, and the calibration procedure is complete.

The DSP 90 can optionally use a dynamic signal received from the microphone 109, to calculate a required level calibration and other dynamic parameter changes to the high-level signal path 46 and the low-level signal path 47 with the result being that before, during, and after a transition event, the acoustic signal is both subjectively perceived, and objectively measured, as being linear and artifact-free.

Figure 16:
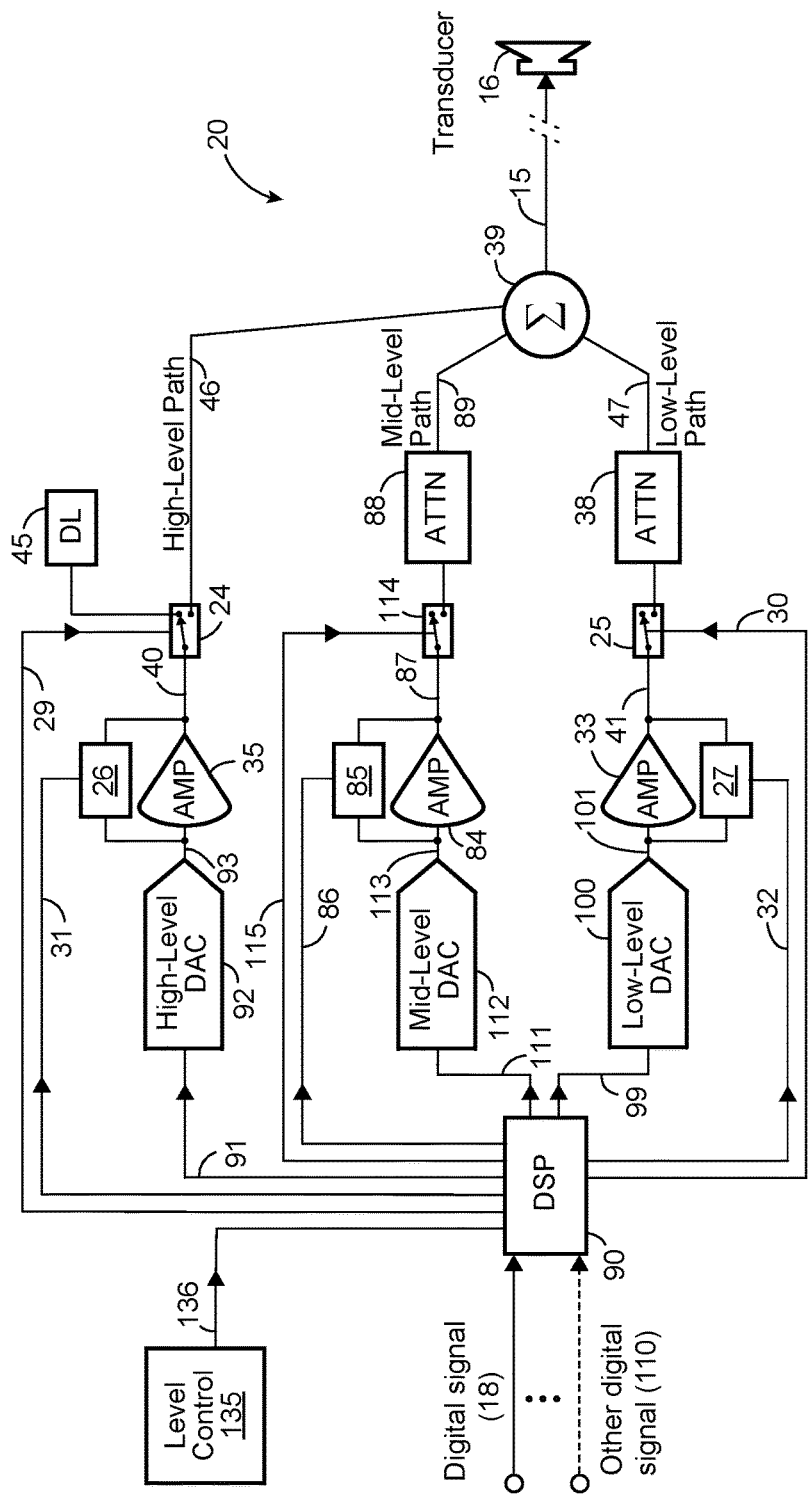
FIG. 16 illustrates the block diagram of FIG. 3 in more detail.
Figure 17:
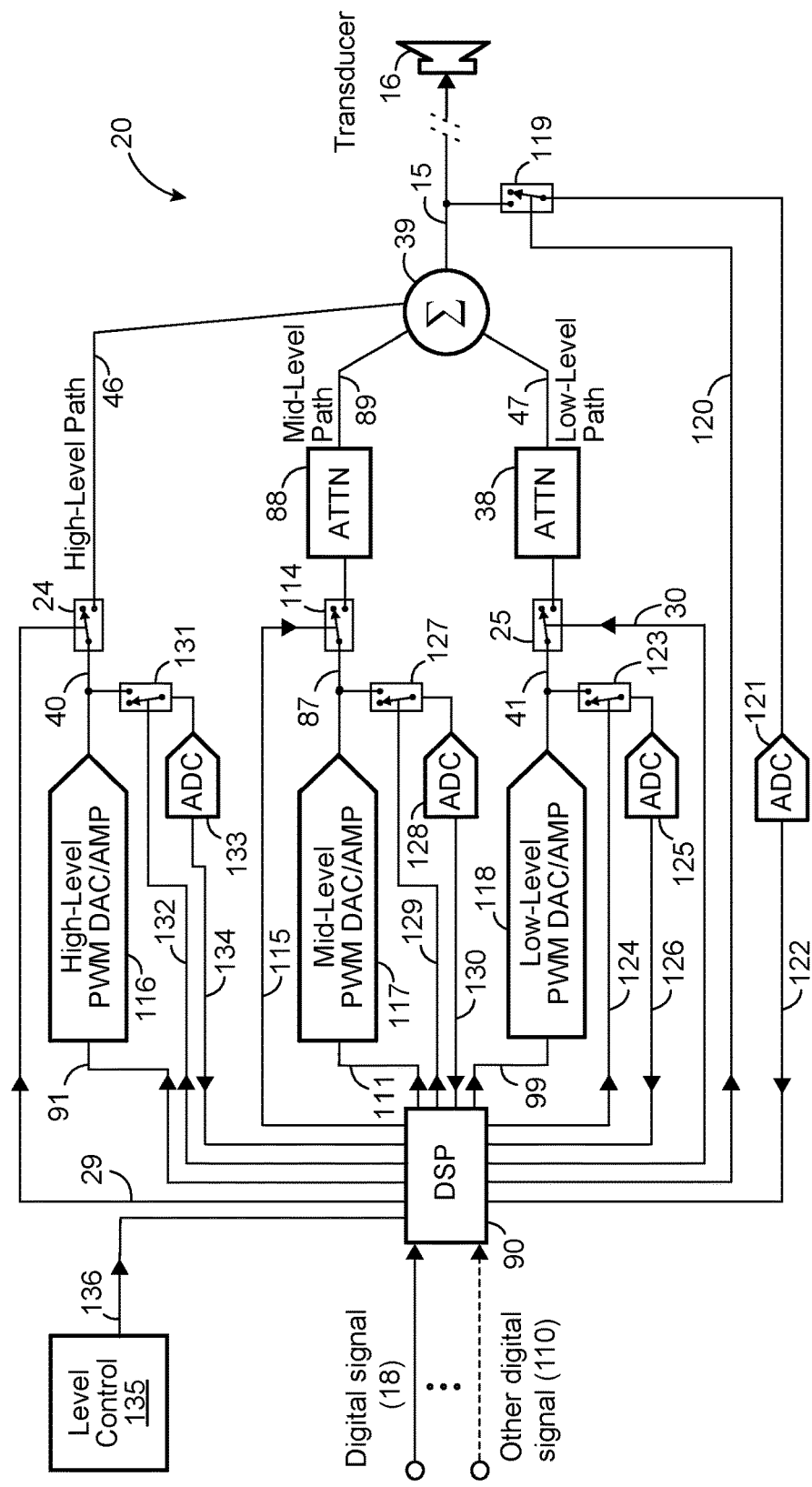
FIG. 17 illustrates an alternative detailed block diagram of FIG. 3 with a PWM amplifier replacing both the DAC and the amplifier.

FIG. 16 illustrates the block diagram of FIG. 3 of a multi-path digital amplifier in more detail. FIG. 17 illustrates an alternative detailed block diagram of FIG. 3 with PWM amplifiers 116, 117, 118 replacing both the DACs 92, 100, 112 and the amplifiers 35, 84, 33 of FIG. 16. The multi-path digital power amplifier 20 of FIGS. 16 and 17 uses the DSP 90 to map the digital signal 18 to multiple DACs or equivalent device for converting digital-to-analog signals such as the PWM amplifier of FIG. 17. Each DAC receives a portion of the digital signal 18 based on level range. The DSP 90 will map the signal to the usable bits of the DAC (i.e. those above the DAC's noise-floor). Depending on the signal range path, the output signals of a particular DAC is either amplified, passed-through, or attenuated so that resultant analog signals, when summed, represent a linearly amplified version of the digital signal 18.

The multi-path digital power amplifier 20 parses the digital signal 18 into bit-groupings according to signal level range, similarly to what as previously described for FIGS. 11 and 12. In FIGS. 16 and 17, the DSP 90 parses the digital signal 18 into three groupings instead of two for FIGS. 11 and 12. While three groupings are shown, this can be extended to more groupings using the same principles described here. Note that the input signal to the multi-path can optionally be multiple pre-adapted digital sources labeled as other digital signals 110.

In FIG. 16, the highest order bit-grouping is routed to DAC 92 via the signal path 91. The middle bit-grouping is routed to DAC 112 by signal path 111, and the lowest order bit-grouping is routed to DAC 100 by signal path 99. The output signal of DACs 92, 112, 100 is sent to amplifiers 35, 84, 33 via signal paths 93, 113, 101 respectively. In FIG. 17, a PWM amplifier 116, 117, 118 replaces both the DACs 92, 112, 100 and the amplifiers 35, 84, 33. The highest order bit-grouping is routed to PWM amplifier 116 by signal path 91. The middle bit-grouping is routed to PWM Amplifier 117 by signal path 111, and the lowest order bit-grouping is routed to PWM Amplifier 118 by signal path 99.

The amplifiers 84, 33 of FIG. 16 drive the mid-level signal path 89 and the low-level signal path 47 through the attenuators 88, 38 via amplifier output paths 87, 41 and electronically controlled switches 114, 25 respectively. The amplifier 35 drives the high-level signal path 46 via amplifier output path 40 through electronically controlled switch 24. When the high-level signal path 46 is not engaged, the amplifier output path 40 can optionally be routed by electronically controlled switch 24 to the dummy load 45. The gain of amplifiers 35, 84, 33 are controlled by the DSP 90 via gain elements 26, 85, 27 through control signal paths 31, 86, and 32 respectively. Similarly, the PWM amplifiers 117, 118 of FIG. 17 drive the mid-level signal path 89 and the low-level signal path 47 through the attenuators 88, 38 via amplifier output paths 87, 41 and electronically controlled switches 114, 25 respectively. For simplicity, the gain control of the PWM amplifiers 116, 117, 118 is not shown. The PWM amplifier 116 drives the high-level signal path 46 via amplifier output paths 40 through the electronically controlled switch 24. In both FIGS. 16 and 17, the electronically controlled switches 24, 114, 25 are controlled by the DSP 90 through control signal paths 29, 115, 30, respectively. Signal paths 91, 111, and 99 are delayed by the DSP 90 in relation to the control signal paths to give the DSP 90 "pre-knowledge" of when signals will be present on the amplifier output paths 40, 87, and 41 respectively. This allows the DSP 90 to optimally transition between the high-level signal path 46, the mid-level signal path 89, and the low-level signal path 47 and minimize transition non-linearities and glitches. Amplifiers 35, 84, 33 of FIG. 16 and the PWM amplifiers 116, 117, 118 of FIG. 17 should possess sufficiently low noise, low output impedance, high output current, and high output voltage to be summed by the summing node 39 and drive the transducer 16 through amplifier output signal 15. The transducer 16 is typically a loudspeaker. Commercial loudspeakers often have impedances ranging from 2 Ohms to 16 Ohms. So as to not affect the power transfer, if the attenuators 88, 38 or the summing node 39 utilizes resistive elements, the resistance values of each resistive element can typically be less than 1/10 the value of the impedance of the transducer as to not significantly affect power transfer. For example, to drive a 2 Ohm speaker, the effective resistance value of the attenuator 38, 88 or summing node 39 can typically be 0.2 Ohms or less so to not significantly affect the power transfer. Note that this example is merely meant to aid the reader in understanding and not meant as limiting on the values or types of the attenuator 38, 88 or the summing node 39. Note that the summing node and passive attenuation can also be accomplished by transformers, for example, as exemplified by FIG. 6.

FIG. 17 shows calibration circuitry that includes electronically controlled switch 119, 123, 127, 131 that selectively route the amplifier output signal 15, and the amplifier output paths 41, 87, 40 to ADCs 121, 125, 128, 133 respectively. The electronically controlled switches 119, 123, 127, 131 are controlled by the DSP 90 via control signal path 120, 124, 129, 132 respectively. The ADC output signal 122, 126, 130, 134 are routed to the DSP 90. The system is calibrated in a similar manner to what was described in the discussion of FIG. 15. In addition, the DSP 90 can adjust the overall output of the multi-path digital power amplifier 20 by a level control 135 along control signal path 136.

Figure 18:
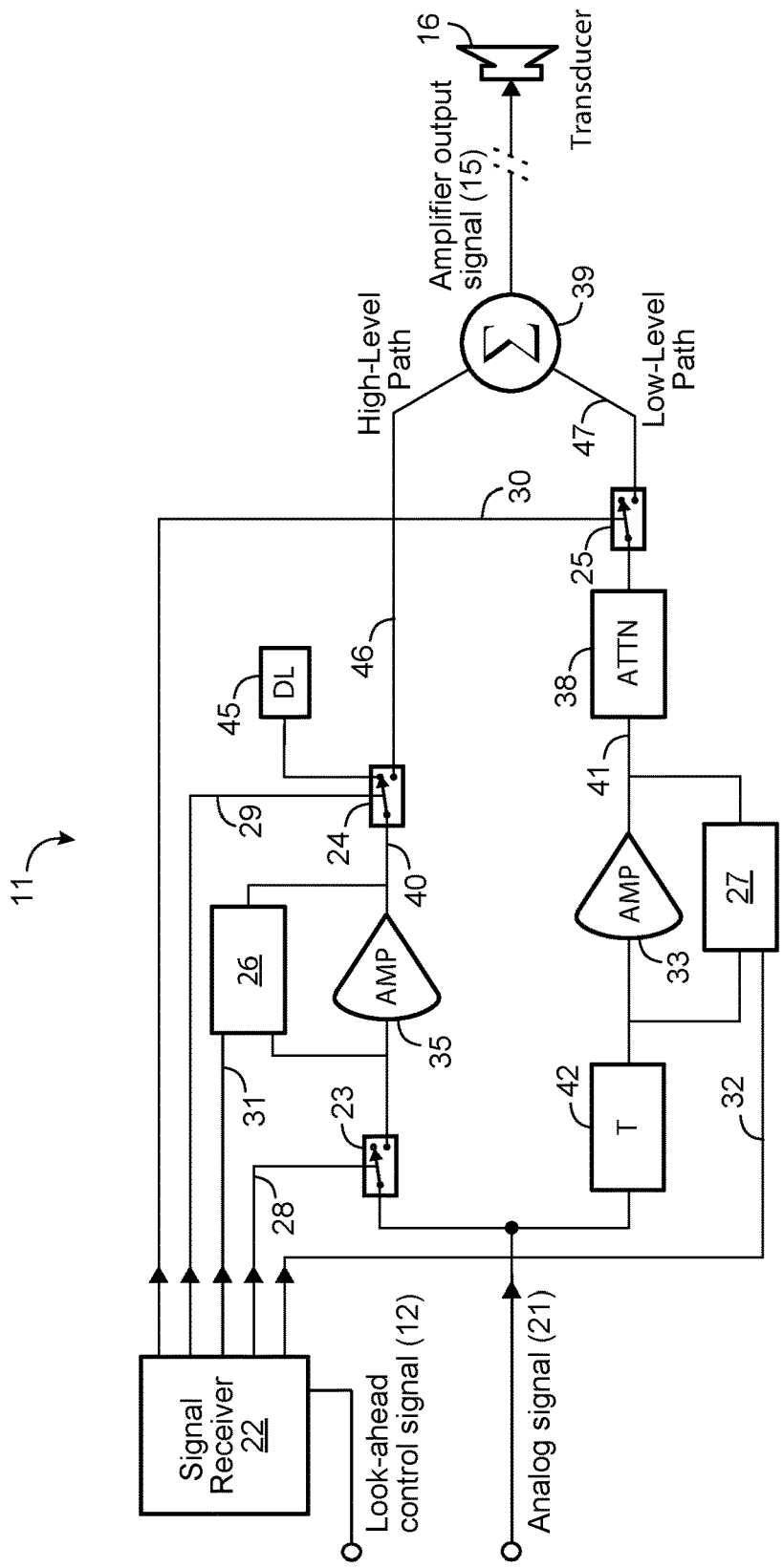
FIG. 18 illustrates the block diagram of FIG. 4 in more detail.
Figure 19:
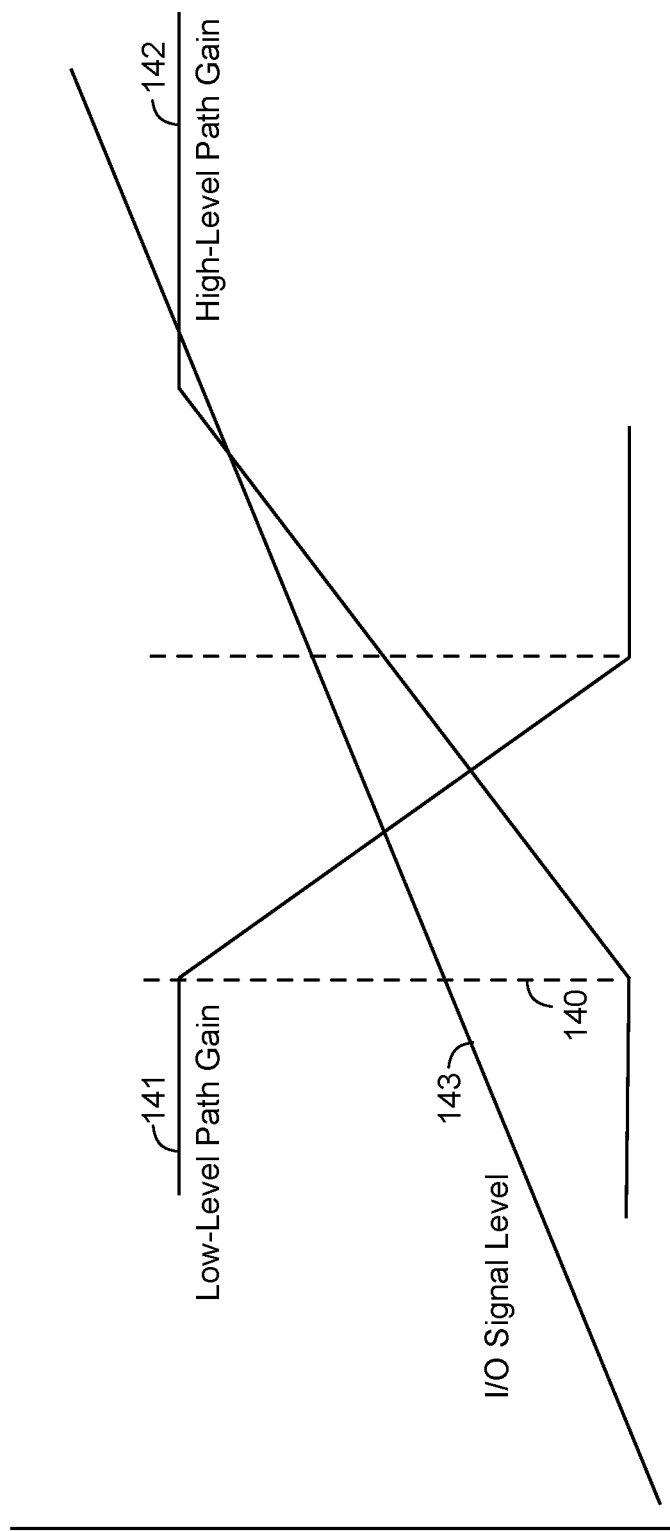
FIG. 19 illustrates a signal level diagram for FIG. 18.

FIG. 18, which illustrates FIG. 4 in more detail, shows a multi-path power amplifier system 10 that adapts the multi-path amplifier 11 to accept a single full dynamic range preconditioned analog signal in combination with the look-ahead control signal 12 related to the preconditioning. The topology of FIG. 18 is similar to the topology of FIG. 5 except both of the amplifiers 33, 35 are fed a common input signal, and a transformer 42 is used on the input of amplifier 33 to create gain without additional self-noise. As in FIG. 5, the high-level signal path 46 and the low-level signal path 47 are optimized for different signal level ranges with high-level signal path 46 being optimized for a higher signal level range than the low-level signal path 47 and with the low-level signal path 47 having a lower self-noise. In addition, the transformer 42 may saturate when a signal optimized for the amplifier 35 is present. An optional electronically controlled switch can be placed before or after the transformer to either prevent the transformer from saturating or to prevent the saturated signal from reaching the amplifier 33. Alternatively, during periods of transformer 42 saturation, the low-path amplifier could be configured by look-ahead control signal 12 into an "off" or "standby" mode. FIG. 19 illustrates a signal level diagram for FIG. 18. Referring to FIG. 18, analog signal 21 selectively feeds amplifier 35 through electronically controlled switch 23. The output of amplifier 35 selectively feeds the high-level signal path 46 through electronically controlled switch 24 via the amplifier output path 40. When the electronically controlled switch 24 does not engage the high-level signal path 46, the output of the amplifier 35 can optionally feed the dummy load 45. The analog signal 21 also feeds amplifier 33 through transformer 42. Transformer 42 provides additional gain with generally significantly less thermal noise or self-noise than its active counterparts. Amplifier 33 feeds attenuator 38 through amplifier output path 41. Attenuator 38 feeds the low-level signal path 47. The low-level signal path 47 and high-level signal path 46 are summed together at summing node 39.

The output of the summing node 39 resulting in the amplifier output signal 15 that feeds transducer 16. The summing can be accomplished by passive resistive summing, transformer summing, and other summing circuitry that is noise and signal optimized for the amplifiers 33, 35. The electronically controlled switches 23, 24 and gain elements 26, 27 are controlled via the control signal paths 28, 29, 31, 32 respectively, by the look-ahead control signal 12 via the signal receiver 22.

Referring to FIG. 18, typical operation of the multi-path amplifier 11 with analog signal 21 is as follows. Without the analog signal 21 present, amplifier 33 is set to operational gain level which is typically unity gain or less than unity gain. The electronically controlled switch 25 can optionally disengage the output of the amplifier 33 from the low-level signal path 47. Amplifier 35 is fully off, with electronically controlled switches 23, 24 in the off position fully disengaging the amplifier 35 from the path of the analog signal 21 and the high-level signal path 46. Referring to FIGS. 18 and 19, as analog signal 21 begins to rise, the amplifier output signal 15 is derived entirely from the low-level signal path 47 which is the combination of the transformer 42, the amplifier 33, and the attenuator 38. The transformer 42 can have sufficient gain so that the lowest active level of the analog signal 21 is amplified above the noise-floor of the amplifier 33. The attenuator 38 will attenuate the signal present on the amplifier output path 41 to offset the gain of the transformer 42. In advance of a pre-determined transition level of analog signal 21, the look-ahead control signal 12 engages the electronically controlled switches 23, 24 via control signal paths 28, 29. As in the multi-path amplifier 11 of FIG. 5, the self-noise of amplifier 35 is masked by amplifier output signal 15. Referring to FIG. 19, at the beginning of the transition phase 140, the look-ahead control signal 12 of FIG. 18 triggers a transition event by lowering the low-level path gain 141 and simultaneously raising the high-path gain 142 in a manner that retains the linearity of the I/O signal level 143. The I/O signal level is the ratio of analog signal 21 divided by the amplifier output signal 15. The I/O signal level (143) remains linear throughout the transition. Electronically controlled switch 25 switches the amplifier output path 41 out of the low-level signal path 47 to prevent the possibility of distortion from the transformer 42, saturated by a high-level signal, being summed into the amplifier output signal 15.

This disclosure has described a multi-path power amplifier in various embodiments and examples. While the description contains specific examples given with the motivation to provide clarity to the reader, these specific examples should not be interpreted as limiting the claimed invention. Other variations are within the scope of the claimed invention.

For example, other elements of the circuits shown could be digitally controlled by the look-ahead control signal, an internal processor, or remote signals if desired. The amplifiers 33, 35 shown in FIGS. 5, 6, 9, 10, 15, 16, and 18 and amplifier 84 of FIGS. 10 and 16 can be any class or topology suitable for the specific signal to be amplified. For example, audio amplifier can be class A, class AB, class D, class DG, class G, class H, or other suitable topologies for amplifying audio signals. The amplifier can be based on bi-polar transistors, field effect transistors (FET), metal oxide semiconductor transistors (MOSFET), vacuum tubes, integrated circuit amplifiers, or other components suitable for amplifying an analog signal and producing sufficient power to drive a transducer. The signal path topology can be single-ended or differential and can include multiple amplifiers in series or parallel.

The gain element 26, 27 of FIGS. 5, 6, 9, 10, 16, and 18 and gain element 85 of FIGS. 10 and 16 can be any suitable digitally controlled gain element for controlling the gain of the amplifier. These include other electronically controlled resistive elements such as digitally controlled resistive ladders, so-called digital potentiometers, motorized physical potentiometers. The gain element can be integral to the amplifier or can be an external element.

The electronically controlled switches 23, 24, 25, 49, 51, 77, 78, 114, 119, 123, 127, 131 can be any electronically controlled switching element suitable for carrying the voltage and current of the signal passing through the switch and having a sufficiently low self-noise for the specific use within the circuit. For example, electronically controlled switches 24, 25 could be an electronically controlled switching element such as a relay because relays can potentially have low internal resistance and handle the current and voltage associated with the output of amplifiers 33, 35. In general, electronically controlled switches include relays, reed relays, FET switches, MOSFET switches, integrated circuit analog switches, and other types with suitable current, voltage handling capacity, and low internal resistance. These circuit elements, or other electronically controlled switching elements, can be used within portions of the circuit provided they meet the self-noise, switching noise, voltage, and current required for the particular portion of the circuit.

While 24-bit and 32-bit data paths have used in several of the examples and figures, these are only merely meant to be examples to add the reader in understanding the reader in understanding the disclosure, by giving specific examples. The reader will recognize, after reading this disclosure, that the multi-path power amplifier system 10 can be used with an input signal of virtually any bit length. For the multi-path DAC 17 of FIGS. 11-14, 16, and 17, allocation of bits, or the level of analog signals, between paths may or may not include overlapping bits or fractional bit levels (i.e., less than one full bit) or overlapping absolute signal levels.

The noise-management switching in and out of high-level signal paths, mid-level signal paths, low-level signal paths or switching amplifier input paths in the various figures, may be rapid or involve fade-ins and fade-outs, or dithering. As previously described, the look-ahead control signal 12 and other equivalent control signals of the various examples, can be generated by a processor with adequate speed, bandwidth, and input/output capabilities to perform the task.

The attenuators 38, 88 can include, but are not limited to voltage dividers, transformers. The attenuators 38, 88 can be electronically controlled. For example, the attenuators 38, 88 can be digitally controlled resistive networks, or relay switch resistive dividers. In addition, attenuators 38, 88 can be combined with the summing node 39 or other summing circuit. Attenuators 38, 88 can typically be passive attenuators such as transformers, resistive voltage dividers and the like. Active attenuators can be readily substituted for passive attenuators, however, these will generally not have the same low self-noise as passive attenuators.

Although certain specific ohmic resistive values given as examples for the attenuators 38, 88, in the various figures, the multi-path power amplifier system 10 can be designed with any resistances appropriate and suitable to low noise and high dynamic level performance. Attenuator 38, 88 may generate values of attenuation or no attenuation. The multi-path power amplifier system 10 can function successfully over a wide range of attenuation values when suitably designed in consort with other parameters of the circuitry. The attenuator 38, 88 are representative of a typical circuit topology for summing of amplifier outputs without adding power loss, noise, or non-linearities that would make the circuit unacceptable for its purpose. As illustrated in FIG. 6, summing and attenuation can be combined by using transformers. In addition, while passive summing can be used to combine output paths for optimal dynamic range, active path summing may also be used, although it should be noted that active summing can increase systemic noise, and hence reduce dynamic range performance.

Although circuits are diagramed and described in terms of discrete items such as amplifiers, DACs, attenuators, passive attenuators, electronically controlled switches, gain elements, and summing nodes, two or more of these functions may be integrated into a single component, such as an integrated circuit or other integrated or modular system. Moreover, a discrete item may become part of another item, e.g., an amplifier function that may be inherent in a particular DAC topology or design so that a DAC element also performs the function of an amplifier.

While multi-path power amplifier systems 10 have been illustrated with 2-path topologies in FIGS. 5, 6, 9, 15, and 18, and three path topologies in FIGS. 10, 16, and 17, it is not limited to only 2-path and 3-path topologies. Using the principles employed for these two topologies, the multi-path power amplifier system 10 can readily be extended to any number of paths.

Although specific analog-to-digital converter calibration procedures are described for FIGS. 9 and 17, the multi-path power amplifier system 10 is not limited to such calibration criteria, and may follow other calibration procedures which may be optimized for various design variations. In addition, electronically controlled resistances may be used in any part of the circuit if required to meet compensation goals. In addition, while multiple ADC feedback paths are shown for clarity, in practice fewer ADC paths may be required to achieve systemic calibration. While single channel ADCs are shown, any number of channels can be configured for time-concurrent operation with appropriate clock and i/o synchronization, as would be understood by those skilled in the art.

Although DACs with particular characteristics may be described for FIGS. 11, 12, 16, and 17, such as a particular bit-width or particular bit mapping or bit arrangement, a particular dynamic range, or a particular noise characteristic, the multi-path DAC 17 is not is not limited to DACs with these characteristics and may employ any type of DAC with suitable characteristics for the circuit topology.

The digital signal 18 of FIGS. 11-17 is typically pulse code modulated (PCM) data formatting. The multi-path DAC of FIGS. 11,12, and 15 and the multi-path digital power amplifier 20 of FIGS. 16 and 17 is not limited to PCM data and may be realized with other formats or data coding, such as pulse density modulation (PDM), or PWM.

While certain descriptions and claims describe digital level shifting, level mapping, or bit mapping using directional language such as "upward" or "downward," such language is used for clarity and may or may not represent a mathematical DSP shift or scalar upward or downward "direction."

To achieve lower noise and/or path-isolation when not in use, active devices (DAC, Amp, etc.) can be powered off or placed into a standby mode, as described in U.S. Pat. No. 9,590,648, "Multi-path Digital-to-Analog Converter," issued on Mar. 7, 2017.

While a certain topology of transformer summing is shown in the drawings by example, the present invention is not limited to any particular transformer summing method or topology. A range of analog summing techniques and topologies can be used that performs the same or similar function.

All of the above variations, and others that will become readily apparent to the reader intended that the scope of a multi-path power amplifier system 10 of the present disclosure. While the examples, embodiments, and variations are helpful to those skilled in the art in understanding the claimed invention, it should be understood that, the scope of the claimed invention is defined by the following claims and their equivalents.

What is claimed is:

1. A power amplifier, comprising:
a first signal path, noise and level optimized for a first signal level range, and including a first amplifier;
a second signal path, noise and level optimized for a second signal level range different from the first signal level range, and including a second amplifier; and
a receiver receives a look-ahead control signal associated with a multi-path digital-to-analog converter and selectively controls a first output of the first amplifier based on the look-ahead control signal.

2. The power amplifier of claim 1, wherein:
the receiver selectively controls a second output of the second amplifier based on the look-ahead control signal.

3. The power amplifier of claim 2, further comprising:
a summing node; and
the first output and the second output are summed by the summing node.

4. The power amplifier of claim 3, wherein the summing node is a passive summing node.

5. The power amplifier of claim 3, further comprising:
a first electronically controlled switch and a second electronically controlled switch;
a first gain element configured to control a first gain level of the first amplifier, and
a second gain element configured to control a second gain level of the second amplifier; and
the receiver utilizes the first electronically controlled switch and the first gain element to selectively control the first output and the second electronically controlled switch and the second gain element to selectively control the second output.

6. The power amplifier of claim 5, wherein:
the second signal path includes an attenuator positioned after the second amplifier.

7. The power amplifier of claim 1, wherein:
a summing node;
the second amplifier includes a second output; and
the first output and the second output are summed by the summing node.

8. The power amplifier of claim 7, wherein the summing node is a passive summing node.

9. The power amplifier of claim 1, further including:
an attenuator positioned along the second signal path after the second amplifier.

10. The power amplifier of claim 1, further comprising:
an electronically controlled switch;
a gain element configured to control a gain of the first amplifier; and
the receiver utilizes the electronically controlled switch and the gain element to selectively control the first output.

11. The power amplifier of claim 1, further including:
a third path, noise and level optimized for a third signal level range different from the first signal level range and the second signal level range, and including a third amplifier.

12. The power amplifier of claim 11, further comprising:
a summing node; and
the first output, a second output of the second amplifier, and a third output of the third amplifier are summed by the summing node.

13. A method for power amplification, comprising:
selectively amplifying a first analog signal path that is noise and level optimized for a first signal level range and a second analog signal path that is noise and level optimized for a second signal level range different from the first signal level range based on information within a look-ahead control signal associated with a multi-path digital-to-analog converter; and
summing a resultant selectively amplified first analog signal and a selectively amplified second analog signal.

14. A power amplifier comprising:
a first digital-to-analog converter and a second digital-to-analog converter;
a processor configured to receive a digital signal and map the digital signal into a first grouping of bits representing a first signal level range and a second grouping of bits representing a second signal level range different from the first signal level range, the first grouping of bits feeds the first digital-to-analog converter and the second grouping of bits feeds the second digital-to-analog converter;
a first amplifier receives a first output signal path of the first digital-to-analog converter and a second amplifier receives a second output signal path of the second digital-to-analog converter; and
the processor generates one or more control signals that selectively control a first output of the first amplifier and a second output the second amplifier based on a pre-determined signal level of the digital signal.

15. The power amplifier of claim 14, further including:
a summing node; and
the first output and the second output are summed by the summing node.

16. The power amplifier of claim 15, further including:
a first electronically controlled switch and a second electronically controlled switch;
a first gain element configured to control a first gain level of the first amplifier, and a second gain element configured to control a second gain level of the second amplifier; and
the one or more control signals utilizes the first electronically controlled switch and the first gain element to selectively control the first output and the second electronically controlled switch and the second gain element to selectively control the second output based on the pre-determined signal level of the digital signal.

17. The power amplifier of claim 14, further including:
a first electronically controlled switch and a second electronically controlled switch;
a first gain element configured to control a first gain level of the first amplifier, and
a second gain element configured to control a second gain level of the second amplifier; and
the one or more control signals utilizes the first electronically controlled switch and the first gain element to selectively control the first output and the second electronically controlled switch and the second gain element to selectively control the second output based on the pre-determined signal level of the digital signal.

18. The power amplifier of claim 14, wherein:
the first amplifier and the first digital-to-analog converter are integral; and
the second amplifier and the second digital-to-analog converter are integral.

19. The power amplifier of claim 14, further including:
an attenuator positioned along a second signal path after the second amplifier.

* * * * *